(12) United States Patent
Hino et al.

(10) Patent No.: US 9,006,819 B2
(45) Date of Patent: Apr. 14, 2015

(54) POWER SEMICONDUCTOR DEVICE AND METHOD FOR MANUFACTURING SAME

(75) Inventors: Shiro Hino, Tokyo (JP); Naruhisa Miura, Tokyo (JP); Shuhei Nakata, Tokyo (JP); Kenichi Ohtsuka, Tokyo (JP); Shoyu Watanabe, Tokyo (JP); Akihiko Furukawa, Tokyo (JP); Yukiyasu Nakao, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 153 days.

(21) Appl. No.: 13/639,738

(22) PCT Filed: Feb. 8, 2011

(86) PCT No.: PCT/JP2011/000683
§ 371 (c)(1),
(2), (4) Date: Oct. 5, 2012

(87) PCT Pub. No.: WO2011/125274
PCT Pub. Date: Oct. 13, 2011

(65) Prior Publication Data
US 2013/0020587 A1    Jan. 24, 2013

(30) Foreign Application Priority Data

Apr. 6, 2010   (JP) ................. 2010-087816

(51) Int. Cl.
*H01L 29/66* (2006.01)
*H01L 29/10* (2006.01)
(Continued)

(52) U.S. Cl.
CPC ...... *H01L 29/1095* (2013.01); *H01L 29/66068* (2013.01); *H01L 29/7805* (2013.01);
(Continued)

(58) Field of Classification Search
CPC . H01L 29/78; H01L 29/7802; H01L 29/7813; H01L 29/0634; H01L 29/783
USPC ............ 257/328, 77, 339, 334, 329, E29.256, 257/E21.41
See application file for complete search history.

(56) References Cited

U.S. PATENT DOCUMENTS 5,169,793 A   12/1992   Okabe et al.
5,250,449 A   10/1993   Kuroyanagi et al.
(Continued)

FOREIGN PATENT DOCUMENTS

CN   101640222 A   2/2010
JP   1-276770 A   11/1989
(Continued)

OTHER PUBLICATIONS

Office Action issued Sep. 30, 2013 in Korean Patent Application No. 10-2012-7026086 (with English language translation).
(Continued)

*Primary Examiner* — Julia Slutsker
(74) *Attorney, Agent, or Firm* — Oblon, McClelland, Maier & Neustadt, L.L.P.

(57) ABSTRACT

A semiconductor device includes a semiconductor substrate of a first conductivity type, a drift layer of the first conductivity type which is formed on a first main surface of the semiconductor substrate, a second well region of a second conductivity type which is formed to surround a cell region of the drift layer, and a source pad for electrically connecting the second well regions and a source region of the cell region through a first well contact hole provided to penetrate a gate insulating film on the second well region, a second well contact hole provided to penetrate a field insulating film on the second well region and a source contact hole.

18 Claims, 19 Drawing Sheets

(51) Int. Cl.
- *H01L 29/78* (2006.01)
- *H01L 29/861* (2006.01)
- *H01L 29/06* (2006.01)
- *H01L 29/16* (2006.01)
- *H01L 29/40* (2006.01)
- *H01L 29/423* (2006.01)
- *H01L 29/739* (2006.01)

(52) U.S. Cl.
CPC ........ *H01L29/7811* (2013.01); *H01L 29/8611* (2013.01); *H01L 29/0615* (2013.01); *H01L 29/0638* (2013.01); *H01L 29/0696* (2013.01); *H01L 29/1608* (2013.01); *H01L 29/402* (2013.01); *H01L 29/42372* (2013.01); *H01L 29/7395* (2013.01)

(56) References Cited

U.S. PATENT DOCUMENTS

| | | | |
|---|---|---|---|
| 5,464,992 | A | 11/1995 | Okabe et al. |
| 5,686,750 | A * | 11/1997 | Takahashi ............... 257/328 |
| 5,723,882 | A | 3/1998 | Okabe et al. |
| 2007/0252168 | A1 | 11/2007 | Shimoida et al. |

FOREIGN PATENT DOCUMENTS

| | | | |
|---|---|---|---|
| JP | 3-252166 | A | 11/1991 |
| JP | 4-229661 | A | 8/1992 |
| JP | 4-346477 | A | 12/1992 |
| JP | 5-198816 | A | 8/1993 |
| JP | 7-249765 | A | 9/1995 |
| JP | 8-102495 | A | 4/1996 |
| JP | 10-56174 | A | 2/1998 |
| JP | 2000-294770 | A | 10/2000 |
| JP | 2003-69016 | | 3/2003 |
| JP | 2004-363477 | A | 12/2004 |
| JP | 2005-243674 | A | 9/2005 |
| JP | 2007-207784 | | 8/2007 |
| JP | 2007-299862 | A | 11/2007 |
| JP | 2009-252811 | | 10/2009 |
| JP | 2009-302091 | A | 12/2009 |

OTHER PUBLICATIONS

U.S. Appl. No. 13/638,970, filed Oct. 2, 2012, Miura, et al.
International Preliminary Report on Patentability issued Oct. 18, 2012 in PCT/JP2011/000683 filed Feb. 8, 2011.
Written Opinion issued May 10, 2011 in PCT/JP2011/000683 filed Feb. 8, 2011 with English language translation.
International Search Report issued May 10, 2011 in PCT/JP2011/000683.
Office Action issued Sep. 17, 2013 in Japanese Patent Application No. 2012-022207 (with English translation).
U.S. Appl. No. 13/806,534, filed Dec. 21, 2012, Furukawa, et al.
U.S. Appl. No. 14/463,286, filed Aug. 19, 2014, Miura, et al.
Office Action issued Nov. 25, 2014 in Japanese Patent Application No. 2014-001303 (with English translation).
Office Action issued Oct. 31, 2014 in Chinese Patent Application No. 201180016343.1 (with English translation).

* cited by examiner

F I G . 1
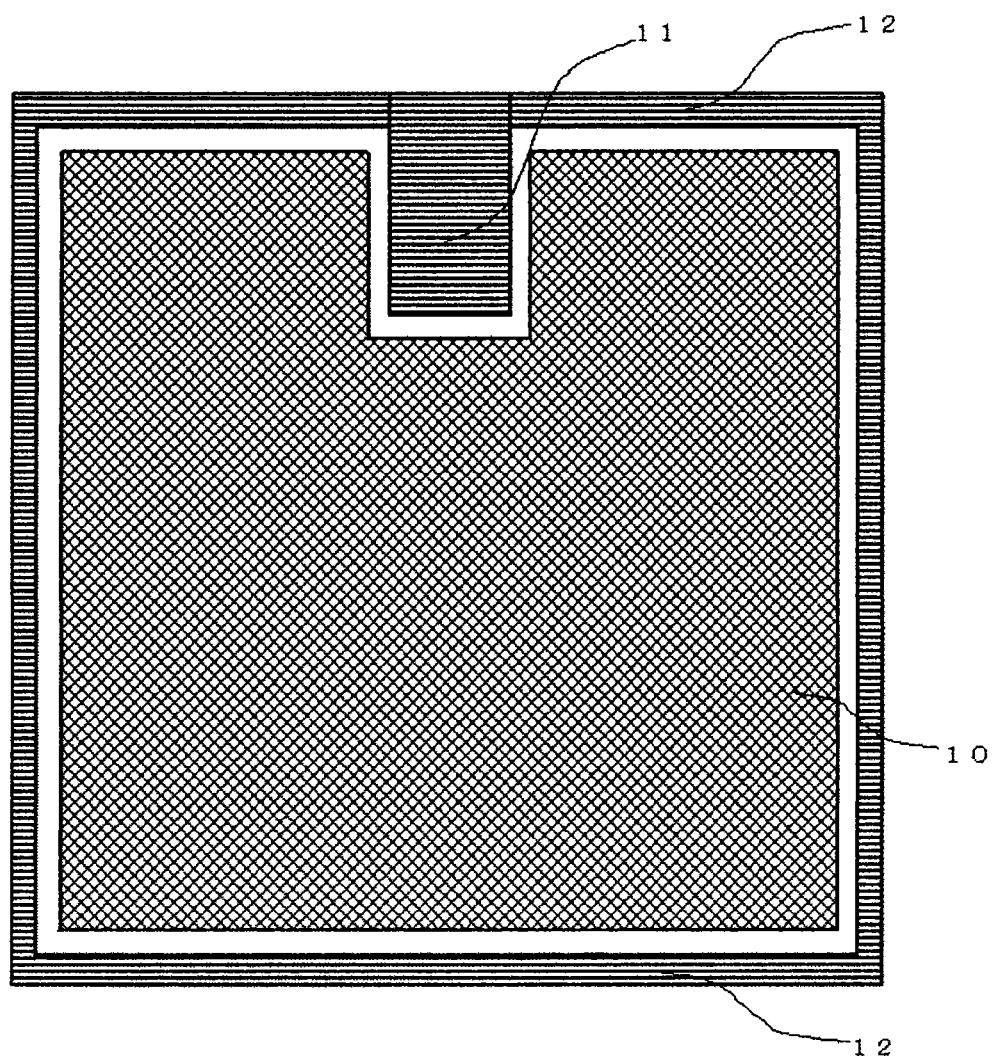

F I G. 5
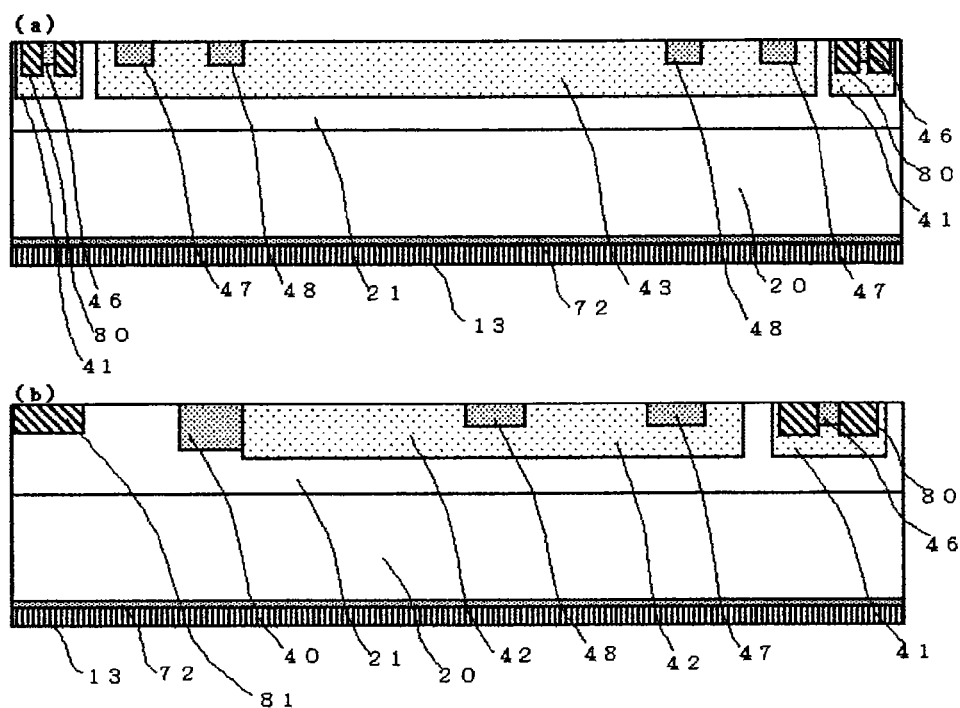

F I G . 6
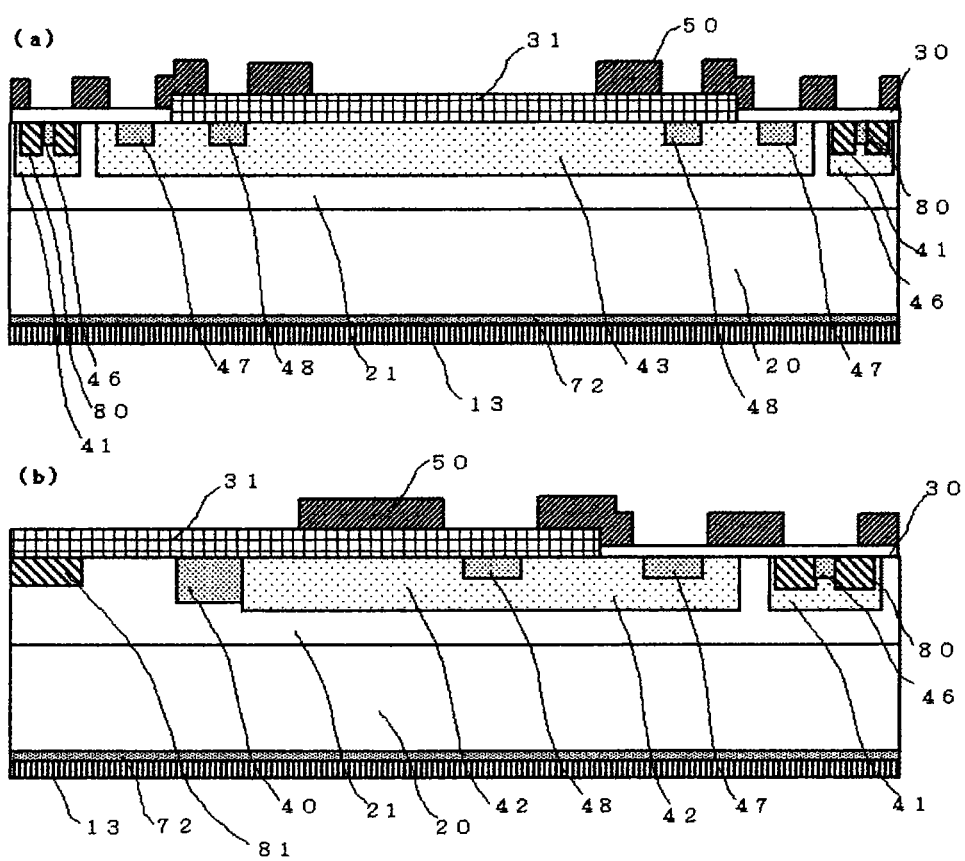

F I G. 7
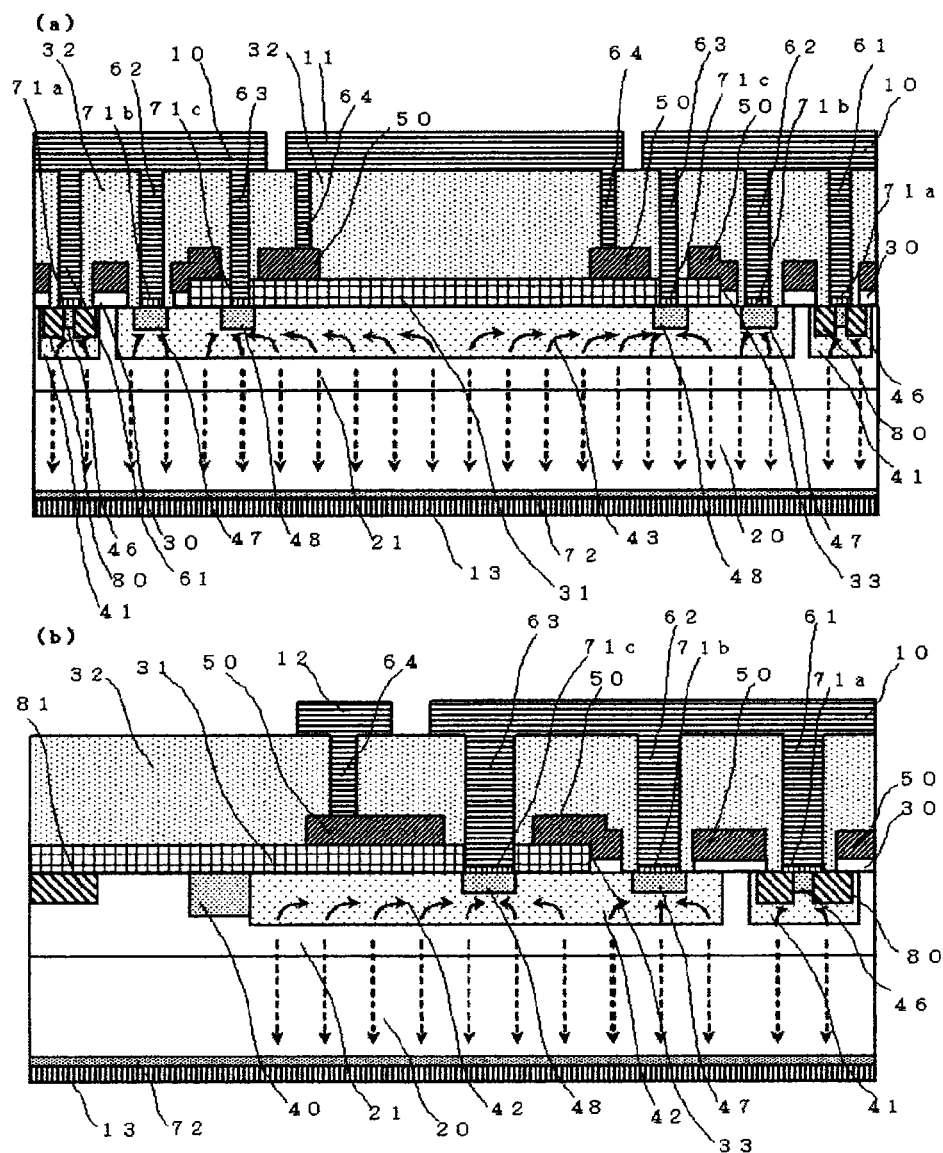

POWER SEMICONDUCTOR DEVICE AND METHOD FOR MANUFACTURING SAME

TECHNICAL FIELD

The present invention relates to a power semiconductor device such as a silicon carbide semiconductor device.

BACKGROUND ART

In a power semiconductor device constituted by a power vertical metal oxide semiconductor field effect transistor (MOSFET) described in Patent Document 1 and a diode, the diode is disposed in at least one line in an adjacent region to a peripheral edge part of a cell region of the MOSFET, that is, a gate pad portion as shown in FIGS. 1 and 2 of the same Document. Each diode absorbs a hole injected in a forward bias from a P well and a P base into an N-type semiconductor layer on a drain side as shown in FIG. 2 of the same Document when the MOSFET is switched from an ON state to an OFF state. For this reason, the structure disclosed in the same Document can prevent a parasitic transistor shown in FIG. 3 of the same Document from being turned ON when the MOSFET is switched from the forward bias to a reverse bias.

With the structure in the same Document, the P base to be the P well of the MOSFET is electrically connected to a source electrode through a back gate as shown in FIG. 2.

PRIOR ART DOCUMENT

Patent Document

Patent Document 1: Japanese Patent Application Laid-Open No. 5-198816 (FIGS. 1 to 3)

SUMMARY OF THE INVENTION

Problem to be Solved by the Invention

Problems to be solved by the present invention will be described below with reference to FIG. 2 of the Patent Document 1.

When the MOSFET of the power semiconductor device described in the Patent Document 1 is switched from an ON state to an OFF state, a drain voltage of the MOSFET, that is, a voltage of a drain electrode is suddenly raised and reaches approximately several hundreds V in some cases. By the rise in the drain voltage, a displacement current is generated on a drain electrode side and a source electrode side through a depletion layer capacitance formed between a P well and an N-drain layer when the OFF state is brought. The displacement current is also generated in a diode as well as the P well of the MOSFET in the P well or a place where a P-type region is provided in the N-drain layer in the same manner as the P well.

The displacement current generated on the drain electrode side exactly flows to the drain electrode, and the displacement current generated on the source electrode side flows to the source electrode via the P well or the P-type region.

In the case of the power semiconductor device described in the Patent Document 1, a source electrode and a field plate are electrically connected to each other as described in the description of the related art. For this reason, in a section shown in FIG. 2(C), for example, a displacement current flowing into a P well provided under a gate pad flows toward a contact hole connected to the field plate in an MOSFET cell direction in the P well provided under the gate pad and flows into the source electrode through the field plate.

An area of the P well provided under the gate pad is much larger than areas of a P well of an MOSFET cell and a P well of a diode cell. When the displacement current flows to the P well provided under the gate pad, therefore, a voltage which cannot be disregarded is generated in the P well because the P well itself having a large area and a contact hole have resistances having great resistance values to some degree. As a result, a comparatively high electric potential is generated in a position in a P well having a great distance in a planar direction from a place (a contact hole) in which the P well is electrically connected to a source electrode (which is usually connected to a ground potential) through the field plate.

This electric potential is raised when the displacement current is increased, and is raised when a fluctuation dV/dt of a drain voltage V to a time t is increased.

In the power semiconductor device including the MOSFET, a high voltage is generated in the P well as described above when the voltage of the gate electrode approximates to the vicinity of 0 V immediately after the MOSFET is switched from the ON state to the OFF state in a place where a gate insulating film of the MOSFET is interposed between the P well and the gate electrode, and the gate insulating film is broken by a high electric field due to the high voltage in some cases.

The present invention has been made to solve the problem and has an object to provide a power semiconductor device including an MOSFET to be switched at a high speed which can suppress an occurrence of a dielectric breakdown between a gate electrode and a source electrode in the switching and has a high reliability, and a method of manufacturing the same.

Means for Solving the Problem

A power semiconductor device according to the present invention includes a semiconductor substrate of a first conductivity type, a drift layer of the first conductivity type which is formed on a first main surface of the semiconductor substrate, a plurality of first well regions of a second conductivity type which is formed in a part of a surface layer of the drift layer, a source region of the first conductivity type which is formed in a part of a surface layer of each of the first well regions, a second well region of the second conductivity type which is formed apart from the first well regions to surround the first well regions, a gate insulating film formed on the first well regions and the source region, and at the first well region side on the second well region, a field insulating film formed on an opposite side to the first well region side on the second well region and having a greater film thickness than the gate insulating film, a gate electrode formed on the field insulating film and the gate insulating film, a source pad for electrically connecting the first well region and the second well region through a source contact hole formed on the first well region to penetrate the gate insulating film and a second well contact hole formed on the second well region to penetrate the field insulating film, a gate pad connected electrically to the gate electrode, and a drain electrode provided on a second main surface of the semiconductor substrate.

Moreover, a method of manufacturing a power semiconductor device according to the present invention includes the steps of forming a drift layer of a first conductivity type on a first main surface of a semiconductor substrate of the first conductivity type, forming a plurality of first well regions of a second conductivity type in a part of a surface layer of the drift layer, forming a source region of the first conductivity type in a part of a surface layer of each of the first well regions, forming a second well region of the second conductivity type apart from the first well regions to surround the first well regions, forming a field insulating film on an opposite side to the first well region side on the second well region, forming a gate insulating film having a smaller film thickness than the field insulating film on the first well regions and the source region, and at the first well region side on the second well region, forming a gate electrode on the field insulating film and the gate insulating film, forming a first well contact hole on the second well region to penetrate the gate insulating film, forming a second well contact hole on the second well region to penetrate the field insulating film, forming a source pad for electrically connecting the first well region and the second well region through the source contact hole, the first well contact hole and the second well contact hole, forming a gate pad connected electrically to the gate electrode, and forming a drain electrode on a second main surface of the semiconductor substrate.

Effect of the Invention

According to the power semiconductor device in accordance with the present invention, also in the case in which the power semiconductor device is driven at a high speed, it is possible to suppress a dielectric breakdown of a gate insulating film without applying an electric field having a high intensity to the gate insulating film, thereby obtaining a higher reliability.

BRIEF DESCRIPTION OF DRAWINGS

FIG. 1 is a plan view typically illustrating a power semiconductor device according to a first embodiment of the present invention.

FIG. 5 is a sectional view typically illustrating a part of the power semiconductor device for explaining a process for manufacturing the power semiconductor device according to the first embodiment of the present invention.

FIG. 6 is a sectional view typically illustrating the part of the power semiconductor device for explaining the process for manufacturing the power semiconductor device according to the first embodiment of the present invention.

FIG. 7 is a sectional view typically illustrating the part of the power semiconductor device according to the first embodiment of the present invention.

EMBODIMENT FOR CARRYING OUT THE INVENTION

First Embodiment

In a first embodiment of the present invention, description will be given by using, as an example, a power semiconductor device which mainly includes a vertical n-type channel silicon carbide MOSFET. Although the description will be given by setting a first conductivity type as an n type and a second conductivity type as a p type in the following respective embodiments, a conductivity type of a semiconductor may be reversed.

FIG. 1 is a plan view typically illustrating a power semiconductor device which mainly includes a silicon carbide MOSFET to be the power semiconductor device according to the first embodiment of the present invention, as seen from an upper surface. In FIG. 1, a source pad 10 is provided in a central part of an upper surface of a power semiconductor device. A gate pad 11 is provided on one of sides of the source pad 10 seen from an upper surface. Moreover, a gate wiring 12 is provided to surround the source pad 10 with an extension from the gate pad 11.

The source pad 10 is electrically connected to source electrodes of unit cells of MOSFETs provided in a lower part of the source pad 10, and the gate pad 11 and the gate wiring 12 are electrically connected to a gate electrode of the unit cell and serve to apply, to the gate electrode, a gate voltage supplied from an external control circuit.

Figure 2:
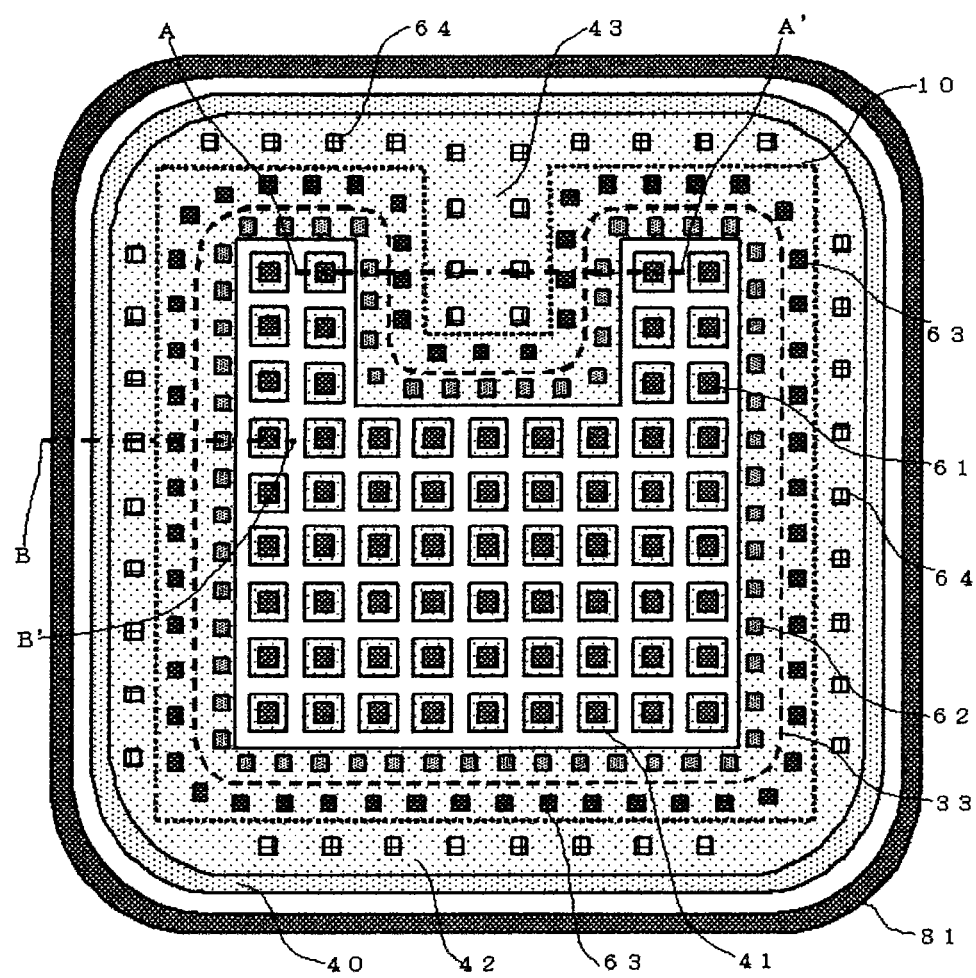
FIG. 2 is a plan view typically illustrating the power semiconductor device according to the first embodiment of the present invention.

FIG. 2 is a perspective plan view illustrating layers provided under the source pad 10, the gate pad 11 and the like in the power semiconductor device according to the present embodiment shown in FIG. 1 as seen from above. In FIG. 2, a hole which is referred to as a second well contact hole 63 is formed in a lower part around the source pad 10 illustrated in FIG. 1 to penetrate an interlayer insulating film (not shown) provided on a whole surface of a lower part of the source pad 10 and a field insulating film (not shown) provided thereunder. Moreover, a first well contact hole 62 is formed to penetrate an interlayer insulating film (not shown) and a gate insulating film (not shown) provided thereunder at an inside of the second well contact hole 63. A boundary between the gate insulating film and the field insulating film which are formed under the interlayer insulating film (a gate insulating film and field insulating film boundary 33) is positioned between the first well contact hole 62 and the second well contact hole 63. Second well regions 42 and 43 formed of p-type silicon carbide are formed on a layer constituted by silicon carbide and provided under the second well contact hole 63 and the first well contact hole 62. Moreover, a p-type junction termination extension (JTE) region 40 is provided on an outside of the second well regions 42 and 43. A field stopper region 81 formed of n-type silicon carbide is formed at a predetermined interval on a further outside of the JTE region 40.

In the plan view of FIG. 2, a cell region provided with a large number of the unit cells is disposed on an inside surrounded by the second well contact hole 63, the first well contact hole 62 and the second well regions 42 and 43. The cell region has a plurality of source contact holes 61 formed on the interlayer insulating film and a first well region 41 formed of p-type silicon carbide in the respective lower parts.

In addition, a gate electrode (not shown) is formed on a part of the upper portion of the second well regions 42 and 43 through a gate insulating film or a field insulating film, and a gate contact hole 64 to be a hole for electrically connecting the gate pad 11, the gate wiring 12 and the gate electrode is formed to penetrate an interlayer insulating film.

Figure 3:
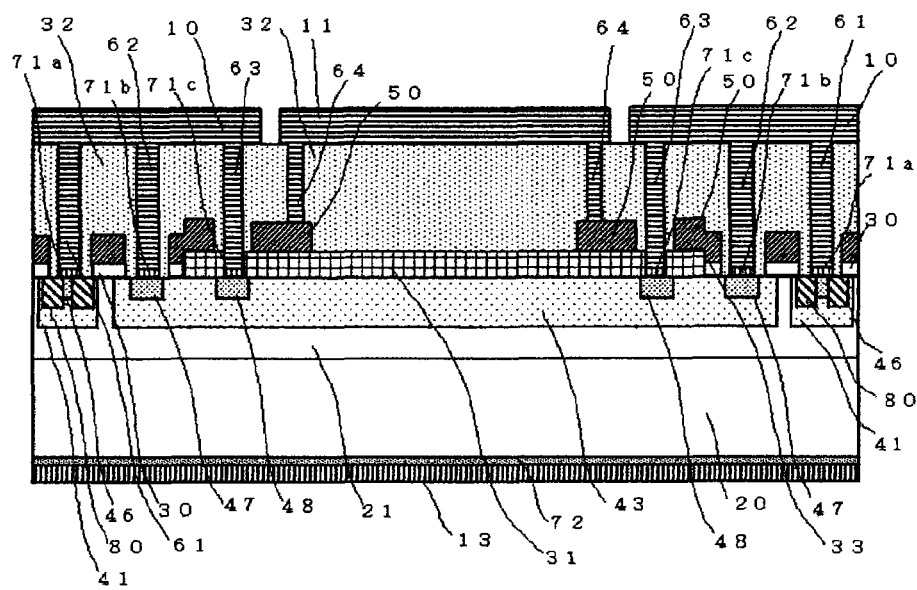
FIG. 3 is a sectional view typically illustrating a section of a part of the power semiconductor device according to the first embodiment of the present invention.
Figure 4:
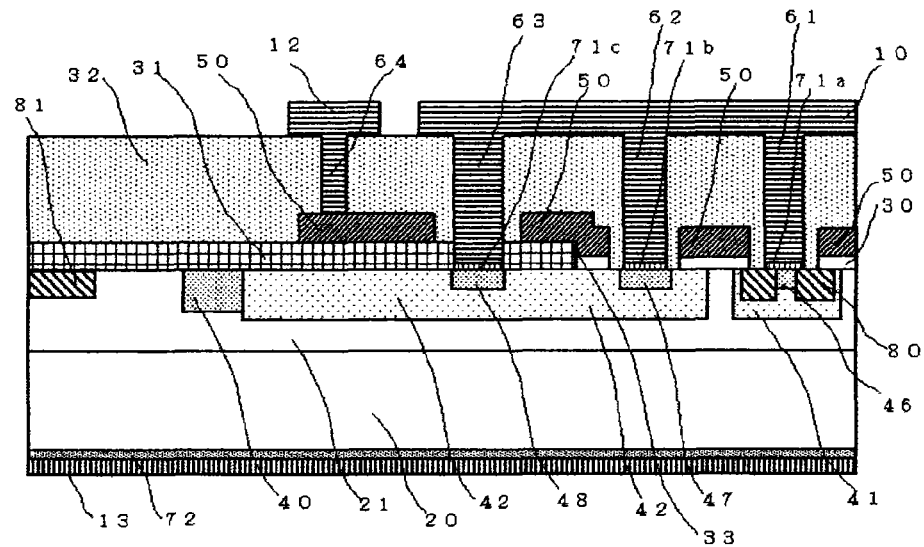
FIG. 4 is a sectional view typically illustrating the section of the part of the power semiconductor device according to the first embodiment of the present invention.

FIGS. 3 and 4 are typical sectional views showing a power semiconductor device according to the present embodiment, typically illustrating a section of an A-A' portion and a section of a B-B' portion in the plan view of FIG. 2, respectively.

In FIGS. 3 and 4, a drift layer 21 constituted by n-type silicon carbide is formed on a surface of a semiconductor substrate 20 constituted by n-type silicon carbine having a low resistance. The second well regions 42 an 43 constituted by p-type silicon carbide are provided in a surface layer portion of the drift layer 21 in an almost corresponding position to a region in which the gate pad 11 and the gate wiring 12 described with reference to FIG. 2 are disposed.

The first well regions 41 constituted by the p-type silicon carbide are provided at at least a predetermined interval from the second well regions 42 and 43 in the surface layer portion of the drift layer 21 at both sides of the second well region 43 in FIG. 3 and a right side of the second well region 42 in FIG. 4, that is, a B' side (an inside surrounded by the second well regions 42 and 43 in FIG. 2). A region in which the first well region 41 or the like is formed corresponds to the cell region described with reference to FIG. 2.

A source region 80 constituted by the n-type silicon carbide is formed in a position recessed inward by a predetermined interval from the outer periphery of the first well region 41 in each surface layer portion of the first well region 41. Moreover, a p-type first well contact region 46 having a low resistance and constituted by silicon carbide is provided in a surface layer portion of an inner part surrounded by the source region 80 in the first well region 41. Furthermore, p-type second and third well contact regions 47 and 48 having low resistances and constituted by silicon carbide are provided in the lower parts of the first and second well contact holes 62 and 63 in the surface layer portions of the second well regions 42 and 43, respectively.

The p-type JTE region 40 constituted by silicon carbide is formed in the surface layer portion of the drift layer 21 on the left side of the second well region 42 in FIG. 4 (the B side, the outside in FIG. 2). The n-type field stopper region 81 constituted by silicon carbide is formed at a predetermined interval on a further left side of the JTE region 40 in FIG. 4 (the B side, the outside of FIG. 2).

A gate insulating film 30 constituted by silicon dioxide or a field insulating film 31 constituted by silicon dioxide is formed in contact with the drift layer 21 in which the first well region 41, the second well regions 42 and 43, the source region 80, the first well contact region 46, the second well contact region 47, the third well contact region 48 and the field stopper region 81 are formed. The gate insulating film 30 is formed on the first well region 41 to be a cell region and a periphery thereof and on the first well region 41 side of the upper part of the second well region 42, and the field insulating film 31 is formed on an opposite side to the first well region 41 side in the upper part of the second well region 42 (the inside of FIG. 3, the left side of FIG. 4, the B side and the outside of FIG. 2). In the power semiconductor device according to the present embodiment, the gate insulating film and field insulating film boundary 33 to be the boundary between the gate insulating film 30 and the field insulating film 31 is formed on the second well regions 42 and 43.

A gate electrode 50 is formed in contact with the gate insulating film 30 and the field insulating film 31 in a part of the upper portions of the gate insulating film 30 and the field insulating film 31. The gate electrode 50 is provided on the gate insulating film 30 over the outer periphery of the first well region 41 or the like to carry out an electrical connection from a portion provided on the gate insulating film 30 to a portion provided on the field insulating film 31. Moreover, the gate electrode 50 is connected to the gate pad 11 or the gate wiring 12 through a gate contact hole 64 formed to penetrate an interlayer insulating film 32 provided on the field insulating film 31 over the field insulating film 31.

A source contact hole 61 is provided to penetrate the interlayer insulating film 32 and the gate insulating film 30 in the source region 80 of the first well region 41 and the upper part of the first well contact region 46. Moreover, the first well contact hole 62 and the second well contact hole 63 are provided to penetrate an insulating film including the interlayer insulating film 32 in the upper parts of the second well contact regions 47 and 48 of the second well regions 42 and 43, respectively. The first well contact hole 62 is provided to penetrate the interlayer insulating film 32 and the gate insulating film 30, and the second well contact hole 63 is provided to penetrate the interlayer insulating film 32 and the field insulating film 31.

The first well region 41 and the second well regions 42 and 43 are electrically connected to each other through the source pad 10 in the source contact hole 61, the first well contact hole 62 and the second well contact hole 63 through an ohmic electrode 71, respectively.

Furthermore, a drain electrode 13 is formed on the back side of the semiconductor substrate 20 through a back ohmic electrode 72.

Next, a method of manufacturing a power semiconductor device according to the present embodiment will be described with reference to FIGS. 5 and 6. FIGS. 5 and 6 are sectional views typically illustrating a part of a power semiconductor device for explaining a process for manufacturing the power semiconductor device according to the present embodiment. Each part (a) of FIGS. 5 and 6 corresponds to a sectional view showing an A-A' sectional portion in FIG. 2 and each part (b) of FIGS. 5 and 6 corresponds to a sectional view showing a B-B' sectional portion in FIG. 2.

The method of manufacturing a power semiconductor device according to the present embodiment will be described below in order.

First of all, the drift layer 21 constituted by silicon carbide having an n-type impurity concentration of $1\times10^{13}$ cm$^{-3}$ to $1\times10^{18}$ cm$^{-3}$ and a thickness of 4 to 200 µm is epitaxially grown, by the chemical vapor deposition (CVD) process, on a surface (a first main surface) over the n-type semiconductor substrate 20 having a low resistance and formed of silicon carbide. Although there is used the semiconductor substrate 20 of the silicon carbide which has an orientation of (0001) plane in the first main surface, a 4H polytype, and an inclination of 8° or less with respect to a c-axis direction, it may have another orientation, polytype and inclination or no inclination.

As shown in FIG. 5, subsequently, the p-type first well region 41, the p-type second well regions 42 and 43, the p-type JTE region 40, the n-type source region 80, the n-type field stopper region 81, the p-type first well contact region 46, the p-type second well contact region 47 and the p-type third well contact region 48 are formed in a predetermined position of the surface layer of the drift layer 21 by ion implantation. Al (aluminum) or B (boron) is suitable for a p-type impurity which is to be subjected to the ion implantation, and N (nitrogen) or P (phosphorus) is suitable for an n-type impurity which is to be subjected to the ion implantation. Moreover, the semiconductor substrate 20 does not need to be heated positively in the ion implantation or may be heated at 200 to 800° C.

It is necessary to set depths of the first well region 41 and the second well regions 42 and 43 so as not to be greater than a bottom surface of the drift layer 21 which is the epitaxial grown layer, and they are set to have values of 0.3 to 2 µm, for example. Moreover, a p-type impurity concentration of each of the first well region 41 and the second well regions 42 and 43 is set to be higher than the impurity concentration of the drift layer 21 and to be $1\times10^{15}$ cm$^{-3}$ to $1\times10^{19}$ cm$^{-3}$.

A depth of the source region 80 is set in such a manner that a bottom surface thereof does not exceed that of the first well region 41, and an n-type impurity concentration thereof is set to be higher than the p-type impurity concentration of the first well region 41 and to be $1\times10^{17}$ cm$^{-3}$ to $1\times10^{21}$ cm$^{-3}$. It is sufficient that the field stopper region 81 is formed on the same condition as the source region 80.

In the vicinity of a topmost surface of the drift layer 21, however, the p-type impurity concentration of each of the first well region 41 and the second well regions 42 and 43 may be lower than the n-type impurity concentration of the drift layer 21 in order to increase a conductivity in a channel region of the MOSFET.

The first well contact region 46, the second well contact region 47 and the third well contact region 48 are provided with the ohmic electrode 71 interposed therebetween in order to obtain an excellent electrical contact of the first well region 41 and the second well regions 42 and 43 with the source pad 10 respectively, and it is desirable that the impurity concentrations should be set to be higher than the p-type impurity concentrations of the first well region 41 and the second well regions 42 and 43. In the ion implantation of these impurities having the high concentrations, it is desirable that the semiconductor substrate 20 should be heated to 150° C. or more in order to reduce the resistances of the first well contact region 46, the second well contact region 47 and the third well contact region 48.

Subsequently, annealing is carried out for 0.5 to 60 minutes at a temperature of 1500 to 2200° C. in an inert gas atmosphere such as an argon (Ar) gas or a nitrogen gas or in a vacuum to electrically activate the ion implanted impurity. The annealing may be carried out in a state in which the semiconductor substrate 20 and a film formed thereon are covered with a carbon film. By carrying out the annealing with the carbon film covering, it is possible to prevent roughening of a silicon carbide surface from being caused by residual water, residual oxygen or the like in the device during the annealing.

Next, the surface of the drift layer 21 subjected to the ion implantation as described above is sacrificially oxidized to form a thermal oxide film, and the thermal oxide film is removed by fluoric acid to remove a surface altered layer of the drift layer 21 subjected to the ion implantation so that a clean layer is exposed. Subsequently, a silicon dioxide film having a film thickness of approximately 0.5 to 2 µm which is referred to as the field insulating film 31 is formed in a region other than an almost corresponding position to the cell region by using the CVD process, the photolithography technique or the like. At this time, for example, it is preferable that the field insulating film 31 should be formed over a whole surface and the field insulating film 31 in the almost corresponding position to the cell region should be then removed by the photolithography technique, etching or the like.

Thereafter, the gate insulating film 30 having a smaller thickness than the field insulating film 31 and constituted by a silicon carbide film having a thickness of approximately 1/10 of the thickness of the field insulating film 31 is formed in a region including the cell region as a center by using a thermal oxidation method or a deposition method, for example.

The film thickness of the gate insulating film 30 is preferably equal to or greater than 30 nm and equal to or smaller than 300 nm and is more preferably equal to or greater than 50 nm and equal to or smaller than 150 nm. The film thickness value depends on an extent of a gate voltage and a gate field to drive the MOSFET (a switching operation), and is preferably equal to or smaller than 3 MV/cm for the gate field (an electric field applied to the gate insulating film 30).

Next, the gate electrode 50 constituted by a polycrystal silicon material is formed in a predetermined place on the gate insulating film 30 and the field insulating film 31 by using the CVD process, the photolithography technique or the like as shown in the sectional view of FIG. 6. It is desirable that the polycrystal silicon to be used for the gate electrode 50 should contain P or B and have a low resistance. The P or B may be introduced during a formation of a polycrystal silicon film or by the ion implantation or the like after the film formation.

Moreover, the gate electrode 50 may be a multilayer film of the polycrystal silicon and a metal or a multilayer film of the polycrystal silicon and metal silicide.

An outermost end surface of the gate electrode 50 may be disposed on the field insulating film 31. Thus, it is possible to prevent a deterioration in quality of the gate insulating film 30 which is uncovered on the end surface due to overetching for the end surface through a dry etching treatment.

Then, the interlayer insulating film 32 constituted by a silicon dioxide film is formed on the gate electrode 50 or the like by the deposition process such as the CVD process. Thereafter, the interlayer insulating film 32 in places to be the source contact hole 61, the first well contact hole 62 and the second well contact hole 63 is removed by using the photolithography technique and the dry etching technique.

Next, a metal film containing Ni as a main component is formed by a sputtering method or the like and a heat treatment is then carried out at a temperature of 600 to 1100° C. to react the metal film containing Ni as the main component with the silicon carbide layer, thereby forming silicide between the silicon carbide layer and the metal film. Subsequently, the metal film remaining on the interlayer insulating film 32 other than the silicide formed by the reaction is removed through wet etching using sulfuric acid, nitric acid or hydrochloric acid, or a mixed solution of them and hydrogen peroxide water, or the like.

The silicide thus formed in the source contact hole 61, the first well contact hole 62 and the second contact hole 63 is changed into the ohmic electrodes 71a, 71b and 71c shown in FIGS. 3 and 4 which carry out an ohmic contact for both of the n-type silicon carbide region such as the source region 80 and the p-type silicon carbide region such as the first well region 41.

Furthermore, the interlayer insulating film 32 in a place to be the gate contact hole 64 is removed by using the photolithography technique and the dry etching technique. Subsequently, a metal containing Ni as a main component is formed on the back face of the semiconductor substrate 20 (the second main surface) and is heat treated so that the back ohmic electrode 72 is formed on the back side of the semiconductor substrate 20.

Then, a wiring metal such as Al is formed, by a sputtering method or an evaporation method, on the surface of the semiconductor substrate 20 thus treated, and is processed into a predetermined shape by the photolithography technique so that the source pad 10, the gate pad 11 and the gate wiring 12 are formed. Furthermore, a metal film is formed on the surface of the back ohmic electrode 72 provided on the back face of the substrate so that the drain electrode 13 is formed. Thus, the power semiconductor device shown in the sectional views of FIGS. 3 and 4 is finished.

Next, description will be given to the operation of the power semiconductor device according to the present embodiment.

First of all, description will be given to the structure of the power semiconductor device according to the present embodiment as seen on an electric circuit basis. In the power semiconductor device according to the present embodiment, a diode is formed between the second well regions 42 and 43 of the second conductivity type (the p-type in the present embodiment) connected to the source pad 10 through the first well contact hole 62 and the second well contact hole 63 and the drift layer 21 of the first conductivity type (the n-type in the present embodiment) connected to the drain electrode 13 through the semiconductor substrate 20 and the back ohmic electrode 72. Moreover, a conduction of a region (a channel region) provided in contact with the gate insulating film 30 in the first well region 41 of the second conductivity type between the source region 80 of the first conductivity type and the drift layer 21 of the first conductivity type can be controlled with a voltage of the gate electrode 50 provided on the gate insulating film 30, and these constitute a vertical MOSFET. In the power semiconductor device according to the present embodiment, a source and a gate in the MOSFET (the n-type MOSFET in the present embodiment) are integrated with an electrode of a second conductivity type in a pn diode, and a drain of the MOSFET is integrated with an electrode of a first conductivity type of the pn diode so that there is obtained a structure in which the diode is connected in parallel between the source and the drain in the MOSFET.

Subsequently, the operation will be described with reference to FIG. 7. Part (a) and part (b) of FIG. 7 are typical sectional views showing the power semiconductor device according to the present embodiment corresponding to FIGS. 3 and 4 respectively, in which an arrow in the drawing indicates a current flow.

In the power semiconductor device according to the present embodiment, when a voltage to be applied to the gate of the MOSFET (the gate pad 11 in the present embodiment) is changed in such a manner that the MOSFET is switched from an ON state into an OFF state, a voltage of the drain of the MOSFET (the drain electrode 13 in the present embodiment) is rapidly raised and is varied from approximately 0 V to several hundreds V. Consequently, a displacement current flows to both of p-type and n-type regions as shown in FIG. 7 through a parasitic capacitance generated between the p-type first well region 41, the second well regions 42 and 43 and the JTE region 40 and the n-type drift layer 21 respectively. In the p-type region, as typically shown in an arrow of a solid line in FIG. 7, the displacement current flows from the p-type first well region 41, the second well region 42 or the like toward the source pad 10 via the ohmic current 71. In the n-type region, as typically shown in an arrow of a broken line in FIG. 7, the displacement current flows from the n-type drift layer 21 toward the drain electrode 13 via the semiconductor substrate 20 and the back ohmic electrode 72.

By these displacement currents, there are generated voltages determined by a resistance value in a region where the displacement current flows and a value of the displacement current. Since an area of the first well region 41 is not large, however, a resistance value of the same region is not great so that the voltage to be generated is maintained to have a value to some degree. On the other hand, the p-type region obtained by adding the second well regions 42 and 43 and the JTE region 40 connected thereto has a large area. Therefore, a large current corresponding to the area flows. Moreover, there are the second well regions 42 and 43 and the JTE region 40 which are disposed at a great distance from the first well contact hole 62 and the second well contact hole 63. When a displacement current having a great current value flows from the second well regions 42 and 43 to the source pad 10 via the third well contact region 48 and the ohmic electrode 71c of the second well contact hole 63, thus, a voltage generated in a current path has a great value because a resistance value of the current path including a contact resistance in the vicinity of the contact hole is comparatively great. The voltage generated in the current path is raised when a fluctuation dV/dt of the drain voltage V to a time t is increased.

The power semiconductor device according to the present embodiment has the structure in which most of the displacement current to flow from the second well regions 42 and 43 and the JTE region 40 toward the source pad 10 flows to the source pad 10 via the second well contact hole 63 formed to penetrate the field insulating film 31 having a great film thickness. Therefore, a high voltage is not generated in the second well regions 42 and 43 provided under the gate insulating film 30 so that a high electric field is not applied to the gate insulating film 30.

Also in the case in which the MOSFET is brought into the OFF state so that the voltage of the gate electrode 50 reaches almost 0 V, accordingly, it is possible to prevent the dielectric breakdown of the gate insulating film 30 in a place in which the gate electrode 50 is opposed to the well region through the gate insulating film 30. Even if the operation is carried out on a high dV/dt condition, moreover, an electric field to be generated in the gate insulating film 30 can be reduced so that it is possible to obtain a power semiconductor device having a high reliability.

Description will be given to a high speed driving operation of the MOSFET using a wide band gap semiconductor material such as silicon carbide, that is, a driving operation with high dV/dt again.

In the Si-MOSFET to be a unipolar element using Si (silicon) according to the related art, an operation is carried out at a comparatively high speed, that is, 20 V/nsec or more for an operating speed. When the operation is carried out around or at a higher speed than approximately 1 kV, a conduction loss is increased greatly. Therefore, an operating voltage is limited to several tens to several hundreds V. For this reason, in a high voltage region of approximately 1 kV or more, Si-IGBT (Insulated Gate Bipolar Transistor) is exclusively utilized. Since the IGBT is a bipolar element, however, it is hard to obtain a high speed switching characteristic as in the unipolar element by the influence of minority carriers. In other words, even if dV/dt is increased, a switching loss cannot be decreased greatly. For this reason, the IGBT does not need to be driven at high dV/dt but is used at an operating speed of approximately several V/nsec at most.

On the other hand, in an MOSFET using a wide band gap semiconductor material such as silicon carbide, it is possible to obtain a low conduction loss also in the high voltage region of 1 kV or more, and furthermore, a high speed operation can be carried out because of the unipolar element and the switching loss can be reduced by the high speed switching. Therefore, it is possible to reduce a loss in an inverter operation still more.

In an operation environment which is not present in the Si element according to the related art, that is, high speed switching of 10 V/nsec or more, for example, in the high voltage region operation of 1 kV or more, the voltage generated in the P well by the displacement current in the switching described in the example of the Patent Document 1 is more remarkable.

In the case in which the MOSFET is formed by using a silicon carbide semiconductor material, furthermore, there is no element which is sufficiently shallow and has a p-type impurity level in a band bap of silicon carbide. For this reason, it is impossible to obtain p-type silicon carbide having a low resistivity at the vicinity of a room temperature, and furthermore, a contact resistance of the p-type silicon carbide and a metal is also increased. In the case in which the MOSFET power semiconductor device is constituted by using the silicon carbide, accordingly, a P well constituted by the p-type silicon carbide and a value of a contact resistance of the P well with a metal are particularly increased so that the voltage to be generated by the displacement current is also increased.

For this reason, in the case in which the MOSFET power semiconductor device using the wide band gap semiconductor material, particularly, the silicon carbide is driven with the dV/dt, a voltage generated by a displacement current in switching is especially increased.

On the other hand, according to the power semiconductor device in accordance with the present embodiment which is constituted by the wide band gap semiconductor material, even if an operation is carried out with a high dV/dt condition of 10 V/nsec or the like, an electric field to be applied to a silicon dioxide film to be the gate insulating film 30 can be reduced to be 3 MV/cm or less. Thus, it is possible to obtain a power semiconductor device having a high reliability.

In order to confirm the effect of the present invention, next, the semiconductor device is modeled with an equivalent circuit and the model is used to carry out a numerical simulation for obtaining an electric field to be generated in a gate insulating film. For the model, there are used four types of equivalent circuits representing a region including well regions such as the first well region 41, the second well regions 42 and 43 and the like.

The four types of equivalent circuits are obtained by representing, on a center, a structure surrounded by minute lengths $\Delta x$ and $\Delta y$ in x and y directions as seen from an upper surface with respect to the x and y directions which are orthogonal to each other in parallel with the first main surface of the semiconductor substrate 20.

Figure 8:
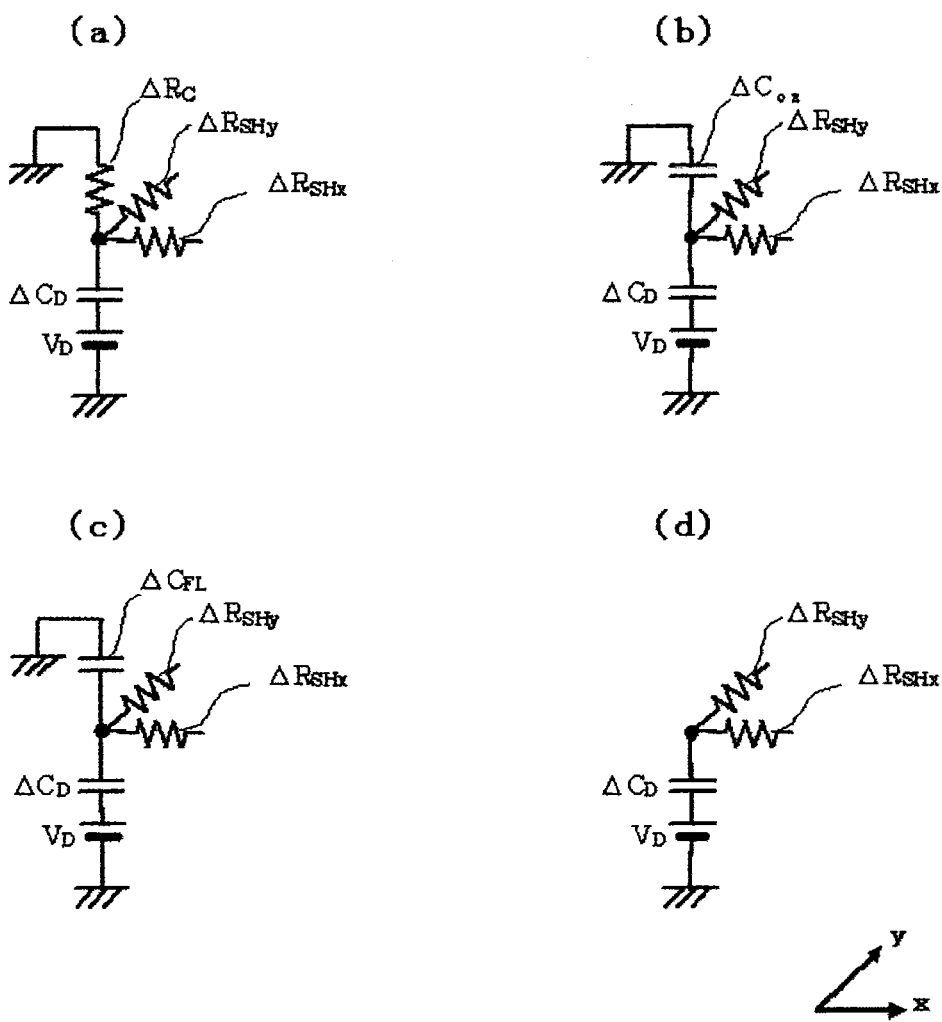
FIG. 8 is a circuit diagram for explaining an equivalent circuit model of the power semiconductor device according to the first embodiment of the present invention.

FIG. 8 shows an equivalent circuit corresponding to each portion of the well region, and part (a) of FIG. 8 shows an equivalent circuit having a minute plane in any of the well regions in which the source pad 10 and the ohmic electrode 71 are formed, part (b) of FIG. 8 shows an equivalent circuit having a minute plane in any of the well regions where the gate electrode 50 is formed through the gate insulating film 30, Part (c) of FIG. 8 shows an equivalent circuit having a minute plane in any of the well regions where the gate electrode 50 is formed through the field insulating film 31, and part (d) of FIG. 8 shows an equivalent circuit having a minute plane in any of the well regions where the source pad 10 and the gate electrode 50 are not provided.

In FIG. 8, resistance components $\Delta R_{SHx}$, and $\Delta R_{SHy}$ of the well region with respect to the x and y directions can be obtained by the following Equations 1 and 2. Herein, $R_{SH}$ represents a sheet resistance of a well region. Moreover, $V_D$ shown in FIG. 8 represents a voltage (a drain voltage) of a drain electrode.

[Equation 1]

$$\Delta R_{SHx} = R_{SH} \frac{\Delta x}{\Delta y} \quad (1)$$

[Equation 2]

$$\Delta R_{SHy} = R_{SH} \frac{\Delta y}{\Delta x} \quad (2)$$

$\Delta C_D$ in part (a) of FIG. 8 represents a depletion layer capacitance of a pn junction formed by a junction of a drift layer of a first conductivity type and a well region of a second conductivity type per minute plane determined by $\Delta x$ and $\Delta y$, and can be calculated by the following Equation 3.

[Equation 3]

$$\Delta C_D = C_D \Delta x \times \Delta y \quad (3)$$

Herein, $C_D$ represents a depletion layer capacitance per unit area, and can be calculated by the following Equation 4 based on a carrier concentration of a first conductivity type, a carrier concentration of a second conductivity type and the like.

[Equation 4]

$$C_D = \sqrt{2q\varepsilon_0\varepsilon_r\left(\frac{1}{N_A}+\frac{1}{N_D}\right)^{-1}(V_d-V)^{-1}} \quad (4)$$

q represents an elementary charge, $\in_0$ represents a dielectric constant of a vacuum, $\in_r$ represents a relative dielectric constant of silicon carbide, $N_D$ represents a carrier concentration of a region of a first conductivity type, $N_A$ represents a carrier concentration of a region of a second conductivity type, $V_d$ represents a diffusion potential of a pn junction, and V represents a voltage to be applied to a pn junction.

Moreover, $\Delta R_c$ shown in part (a) of FIG. 8 represents a contact resistance between a well region and a source electrode per minute plane which is determined by $\Delta x$ and $\Delta y$, and can be calculated by the following Equation 5.

[Equation 5]

$$\Delta R_c = \frac{\rho_c}{\Delta_x \Delta_y} \quad (5)$$

Herein, $\rho_c$ represents a specific contact resistance between a well region and a source electrode.

$\Delta C_{ox}$ shown in part (b) of FIG. 8 represents a gate insulating film capacitance per minute plane determined by $\Delta x$ and $\Delta y$ which is constituted by the well region, the gate insulating film 30 and the gate electrode 50, and can be calculated by the following Equation 6.

[Equation 6]

$$\Delta C_{OX} = \frac{\varepsilon_0 \varepsilon_{OX} \Delta x \Delta y}{d_{OX}} \quad (6)$$

Herein, $\in_{ox}$ represents a specific dielectric constant of the gate insulating film 30 and dox represents a film thickness of the gate insulating film 30.

$\Delta C_{FL}$ shown in part (c) of FIG. 8 represents a field insulating film capacitance per minute plane determined by $\Delta x$ and $\Delta y$ which is constituted by the well region, the field insulating film 31 and the gate electrode 50, and can be calculated by the following Equation 7.

[Equation 7]

$$\Delta C_{FL} = \frac{\varepsilon_0 \varepsilon_{FL} \Delta x \Delta y}{d_{FL}} \quad (7)$$

$\in_{FL}$ represents a specific dielectric constant of the field insulating film 31 and $d_{FL}$ represents a film thickness of the field insulating film 31.

Figure 9:
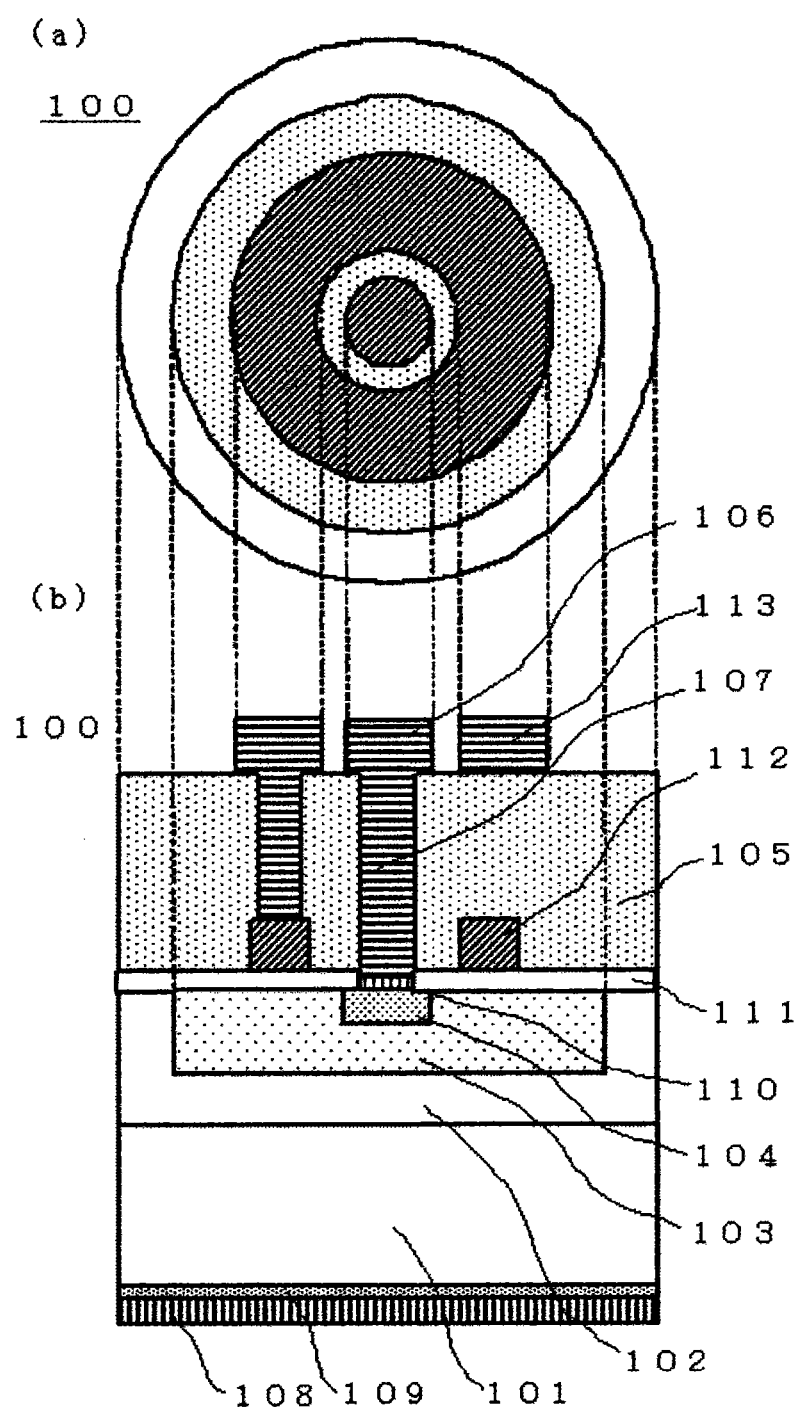
FIG. 9 is plan and sectional views typically illustrating a simplified element for evaluating an equivalent circuit model validity of the power semiconductor device according to the first embodiment of the present invention.

Next, a simplified element 100 shown in FIG. 9 is fabricated to evaluate a validity of the equivalent circuit model illustrated in FIG. 8, and a measured value and a calculated value (a simulation based on a model) in a transient response characteristic of the element are compared with each other.

FIG. 9 is plan and sectional views of the simplified element 100. Part (a) of FIG. 9 is a plan view showing the simplified element 100 and part (b) of FIG. 9 is a sectional view showing the same. As shown in FIG. 9, in the simplified element 100, an n-type layer 102 formed of silicon carbide is epitaxially grown on an n-type semiconductor substrate 101 formed of silicon carbide, and a p-type well region 103 taking a circular shape seen from an upper part is formed in a central part of a surface layer of the n-type layer 102. A p-type well contact 104 taking a circular shape is formed in a central part of a surface layer of the p-type well region 103, and a gate insulating film 111 constituted by silicon dioxide and an interlayer insulating film 105 are formed on the n-type layer 102 and the p-type well region 103 in order from a lower part. A doughnut-shaped gate electrode 112 is formed in an opposed place to the p-type well region 103 provided on the gate insulating film 111. A contact hole 107 penetrating the gate insulating film 111 and the interlayer insulating film 105 is formed on the p-type well contact 104, and an ohmic electrode 110 and an upper electrode 106 are formed therein in order from the p-type well contact 104 side. A gate upper electrode 113 is formed in an upper part of the gate electrode 112 through a contact hole penetrating an interlayer insulating film 105. A back electrode 108 (a drain electrode) is formed on the back side of the n-type semiconductor substrate 101 through a back ohmic electrode 109.

When the upper electrode 106 of the simplified element 100 is set to be 0 V and a rise voltage to be increased from 0 V to several hundreds V is applied to the back electrode 108 of the simplified element 100, a charging current (a displacement current) for charging a pn junction capacitance formed between the p-type well region 103 and the n-type layer 102 is generated in the p-type well region 103 and the n-type layer 102 and flows to the upper electrode 106 via the p-type region 103 and the p-type well contact 104 so that the electric potential of the p-type well region 103 is varied.

Figure 10:
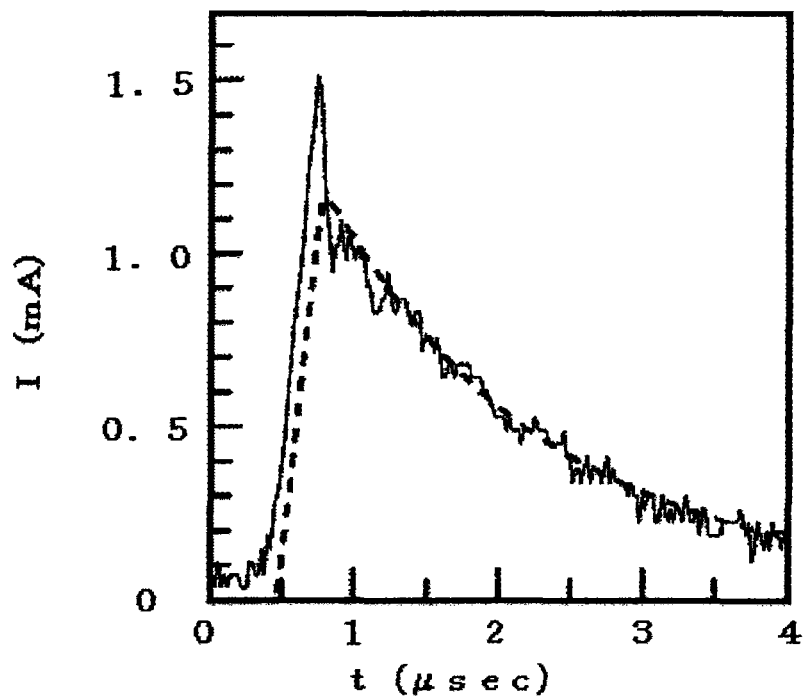
FIG. 10 is a chart showing a time response of an equivalent circuit model evaluating simplified element of the power semiconductor device according to the first embodiment of the present invention.

FIG. 10 shows a measured value and a calculated value of a time dependency of the current flowing from the p-type well region 103 to the upper electrode 106 when a rise voltage to be varied from 0 V to 100 V for 0.3 µsec is applied to the back electrode 108 in a state in which the electric potentials of the upper electrode 106 and the gate upper electrode 113 in the simplified element 100 shown in FIG. 9 are set to be 0 V. In FIG. 10, a solid line indicates the measured value, a broken line indicates the calculated value, an axis of abscissa t indicates a time, and an axis of ordinate I indicates a current value.

The calculated value in FIG. 10 is obtained by regarding the simplified element 100 of FIG. 9 as a circuit in which the equivalent circuit models of parts (a) to (d) of FIG. 8 are combined, and summarizing current flowing to respective $\Delta R_c$ when applying the rise voltage to be varied from 0 V to 100 V for 0.3 µsec to $V_D$. For values of $\Delta C_{ox}$, $R_{SH}$, $\rho_c$ and the like, there is used a value obtained by a measurement through an exclusive evaluation element.

By comparison between the results of the measured value (the solid line) and the calculated value (the broken line) in FIG. 10, it is apparent that both of them are highly coincident with each other. For this reason, it is possible to confirm that the equivalent circuit model shown in FIG. 8 is valid.

Figure 11:
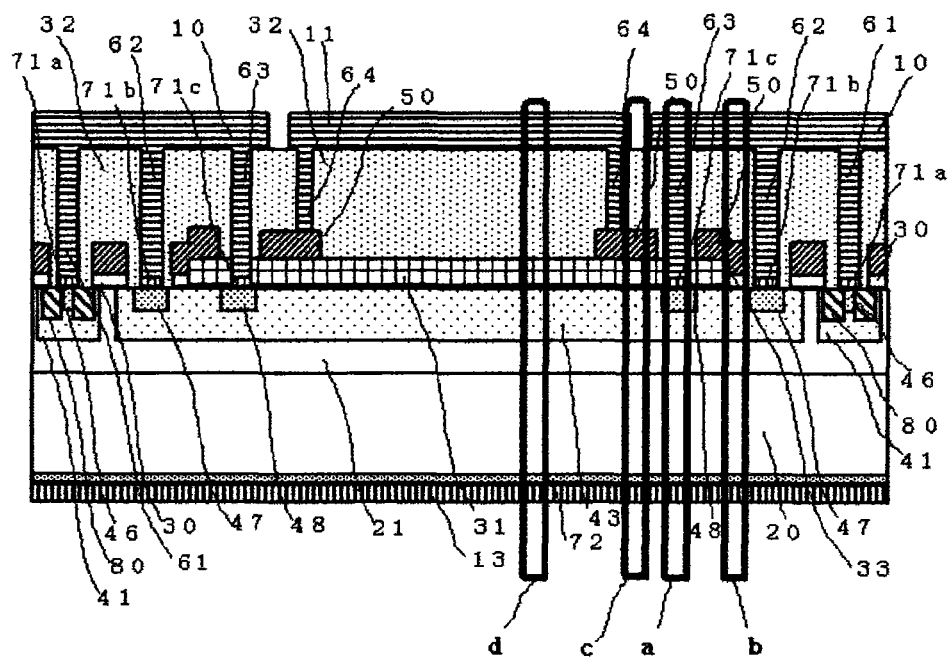
FIG. 11 is a plan view typically illustrating the power semiconductor device according to the first embodiment of the present invention.

Next, the equivalent circuit models shown in parts (a) to (d) of FIG. 8 are used to replace, with equivalent circuits, the structure according to the first embodiment of the present invention shown in FIGS. 3 and 4 and a structure which does not use the present invention, that is, the structure in which the well contact region 48 and the ohmic electrode 71c are removed from the structure in FIGS. 3 and 4, and an electric field intensity generated in the gate insulating film 30 is calculated in a transition from an ON state to an OFF state with the voltage of their drain electrode 13 set to be 30 V/nsec. For example, in the sectional view portion of FIG. 3 in the structure according to the present embodiment, the equivalent circuit models in parts (a) to (d) of FIG. 8 are applied to regions a, b, c and d of a sectional view of FIG. 11.

As a result of the calculation, in the structure which does not use the present invention, a high electric field intensity of 16 MV/cm is calculated as an electric field generated in the gate insulating film 30. On the other hand, in the structure according to the first embodiment of the present invention, there is obtained a result that the electric field intensity generated in the gate insulating film 30 is dramatically reduced to be 1.4 MV/cm. For this matter, an effectiveness of the present invention is quantitatively shown also in an actual vertical MOSFET structure.

According to the structure in accordance with the present embodiment of the present invention, thus, a connecting place from the second well regions 42 and 43 to the source pad 10 is formed on an opposite side to the first well region 41 from the gate insulating film and field insulating film boundary 33 on the second well regions 42 and 43, that is, to penetrate the field insulating film 31. Also in the case in which switch OFF is carried out at a high speed, consequently, a voltage generated by a displacement current can be reduced in the vicinity of the gate insulating film 30 and the electric field intensity to be applied to the gate insulating film 30 can be decreased. The insulating film provided on the well regions such as the second well regions 42 and 43 having a large area can be prevented from a dielectric breakdown.

According to the power semiconductor device in accordance with the present embodiment of the present invention, therefore, it is possible to obtain a semiconductor device having a high reliability in which an insulation failure of the gate insulating film 30 is not caused also in the case in which switching is carried out at a high speed.

Figure 12:
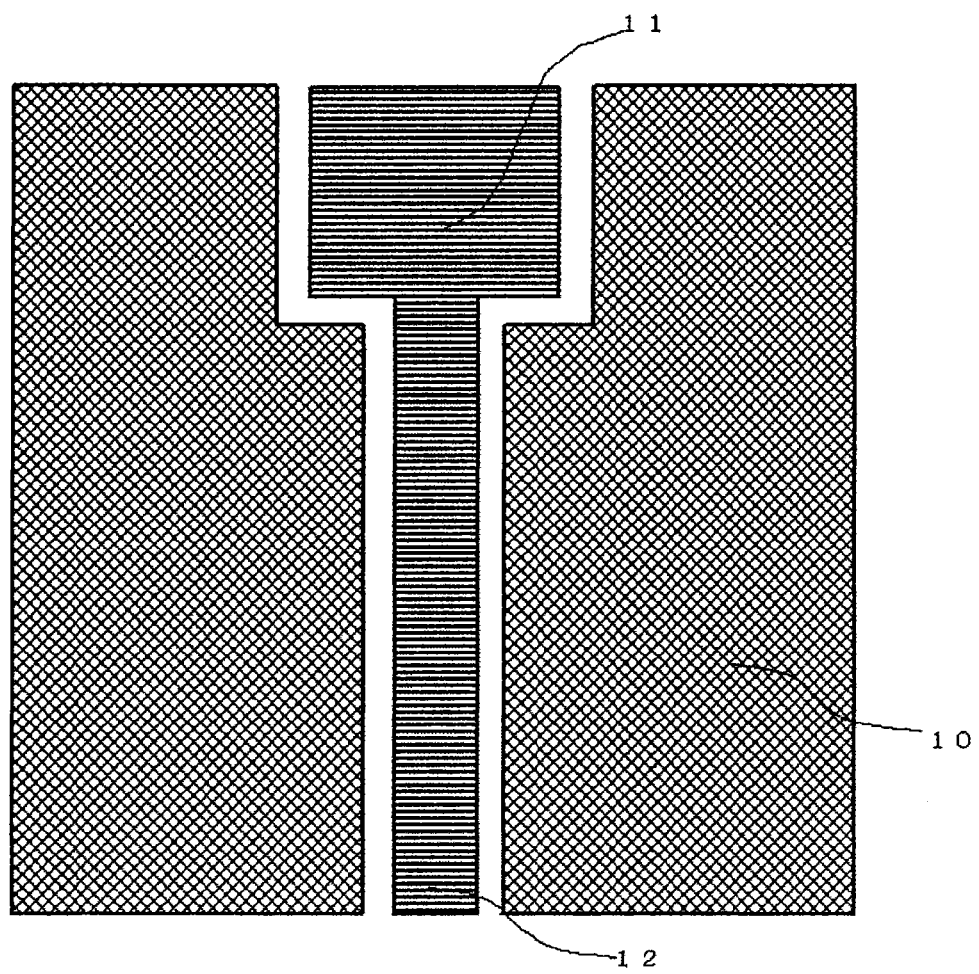
FIG. 12 is a plan view typically illustrating a configuration of the power semiconductor device according to the first embodiment of the present invention.

Although there has been described the example in which the gate pad 11 and the gate wiring 12 are disposed to surround the source pad 10 as shown in FIG. 1 in the power semiconductor device according to the present embodiment, the disposition of the gate pad 11, the source pad 10 and the like may be different from the disposition described above. For example, as shown in FIG. 12, at least one gate wiring 12 having a smaller line width than the gate pad 11 may be disposed alternately with an active region. Also in the case of the arrangement of the gate pad 11 and the source pad 10 shown in FIG. 12, the connecting place from the second well regions 42 and 43 to the source pad 10 is formed on the field insulating film 31 side of the gate insulating film and field insulating film boundary 33, that is, to penetrate the field insulating film 31. Also in the case in which the switching is carried out at a high speed, consequently, the insulation failure of the gate insulating film 30 is not caused but a semiconductor device having a high reliability can be obtained.

Thus, the position and number of the gate pads 11, the shape of the source pad 10 and the like may be various in some cases. However, the effect of the power semiconductor device according to the present embodiment is not influenced at all. Moreover, the second well regions 42 and 43 provided under the first well contact hole 62 and the second well contact hole 63 respectively are not integrated but may be provided separately.

Figure 13:
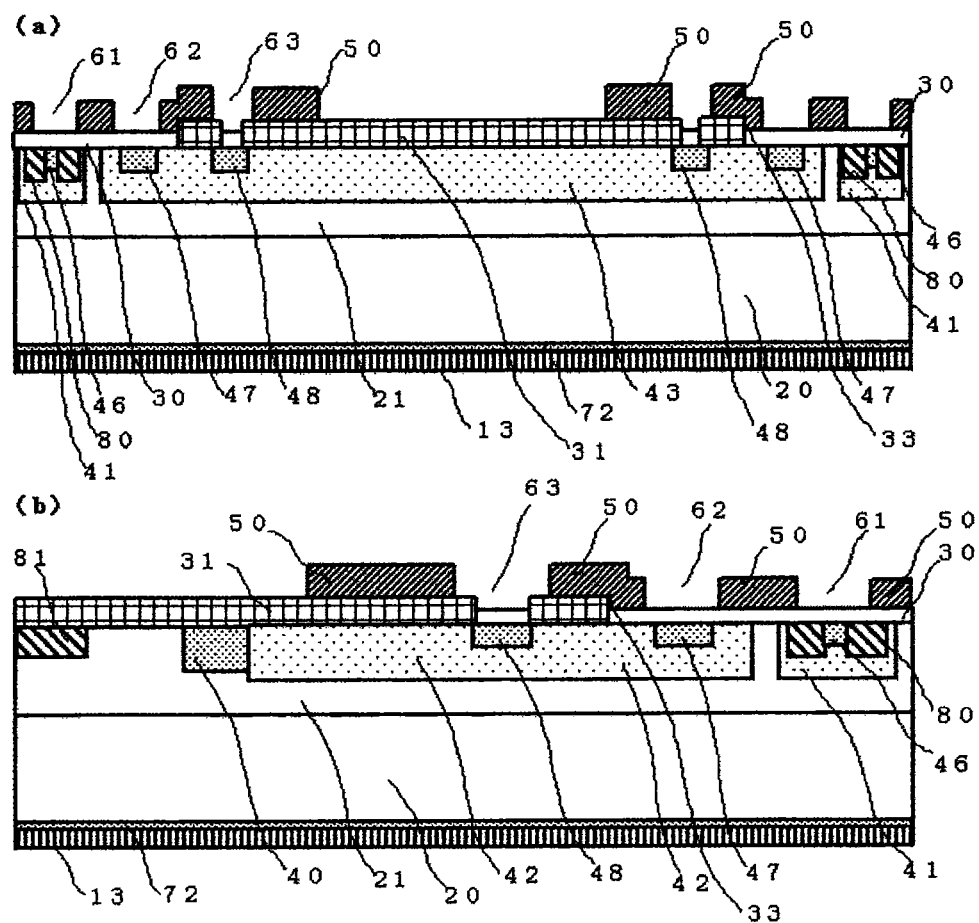
FIG. 13 is a sectional view typically illustrating a part of the power semiconductor device for explaining the process for manufacturing the power semiconductor device according to the first embodiment of the present invention.

In a method of manufacturing the power semiconductor device according to the present embodiment, moreover, it is preferable that the field insulating film 31 in the place in which the second well contact hole 63 is to be formed should be previously etched in the same manner as the cell region in which the gate insulating film 30 is to be formed as shown in a typical sectional view illustrating the power semiconductor device in the middle of the manufacturing process in FIG. 13. FIG. 13 is the typical sectional view showing a state in which the field insulating film 31 is formed after the step illustrated in FIG. 5 and a place to be the second well contact hole 63 is subjected to etching, and the gate insulating film 30 is thereafter formed, and corresponds to the stage illustrated in FIG. 6.

By previously removing the field insulating film 31 in a position to be the second well contact hole 63 in the field insulating film 31 provided on the second well regions 42 and 43, it is possible to form the second well contact hole 63 simultaneously with the formation of the source contact hole 61 on the same condition, for example. As compared with the case in which there is manufactured the conventional power semiconductor device that is not provided with the second well contact hole 63 to be the feature of the present invention, it is possible to manufacture the power semiconductor device according to the present embodiment without increasing the manufacturing steps.

Although the description has been given to the power semiconductor device according to the present embodiment in which the first well contact region 46, the second well contact region 47 and the third well contact region 48 are provided to reduce a contact resistance between the ohmic electrode 71, and the first well region 41 and the second well regions 42 and 43, moreover, these well contact regions are not essential and do not need to be provided. In other words, if a contact resistance having a sufficiently low contact resistance is obtained by changing a metal forming the ohmic electrode 71 to be suitable for p-type silicon carbide, it is not necessary to form these well contact regions 46 to 48. Furthermore, the field stopper region 81 is not essential and does not need to be provided.

Although the formation of the source contact hole 61, the first well contact hole 62 and the second well contact hole 63 is carried out separately from the formation of the gate contact hole 64 in the description of the method of manufacturing a power semiconductor device according to the present embodiment, moreover, the formation of the source contact hole 61, the first well contact hole 62 and the second well contact hole 63 may be carried out simultaneously with the formation of the gate contact hole 64. By carrying out the formation of the source contact hole 61, the first well contact hole 62 and the second well contact hole 63 and the formation of the gate contact hole 64 at the same time, it is possible to decrease the steps, thereby reducing a cost in a manufacture. At this time, silicide is formed on the surface of the gate electrode 50 at the bottom surface of the gate contact hole 64 depending on the selection of each constituent material in some cases.

Although the heat treatment for forming the ohmic electrode 71 at the surface side is carried out separately from the heat treatment for forming the back ohmic electrode 72 at the back side in the description of the method of manufacturing a power semiconductor device according to the present embodiment, moreover, it is also possible to form a metal containing Ni as a main component on both the surface side and the back side and to then carry out the heat treatment, thereby forming the ohmic electrode 71 on the surface side and the ohmic electrode 72 on the back side at the same time. Thus, it is also possible to decrease the steps, thereby reducing the cost in the manufacture. In addition, all of the ohmic electrodes 71a, 71b and 71c may be formed by an identical intermetallic compound or may be formed by separate intermetallic compounds which are suitable for them. In particular, the ohmic electrode 71a needs an ohmic contact with the source region 80 at a low resistance, and a different intermetallic compound from the other ohmic electrodes may be used. Moreover, the ohmic electrode 71 and the back ohmic electrode 72 are not essential to the present invention, and it is sufficient that an ohmic contact having a low resistance can be obtained even if the ohmic electrode 71 and the back ohmic electrode 72 are not provided.

When forming the ohmic electrode 71 on the surface side, it is also possible to carry out reannealing after removing a metal remaining on the interlayer insulating film 32. By the reannealing, it is further possible to obtain an ohmic contact having a low resistance.

In the power semiconductor device, moreover, an electrode for a temperature sensor and an electrode for a current sensor are formed in a part of the power semiconductor device in some cases. However, these electrodes may be formed in the power semiconductor device according to the present embodiment. The presence of the electrode for a temperature sensor and the electrode for a current sensor does not influence the effect of the power semiconductor device according to the present embodiment at all.

In addition, such an opening as to connect the source pad 10, the gate pad 11 and the gate wiring 12 on the surface of the upper part of the power semiconductor device to an external control circuit may be left and covered with a protective film, for example, a silicon nitride film, polyimide or the like, which is not shown.

Although the description has been given to the example in which the impurity doped polycrystal silicon is used as the material of the gate electrode 50 in the power semiconductor device according to the present embodiment, furthermore, the resistance of the impurity doped polycrystal silicon is not sufficiently low. For this reason, the electric potential of the gate electrode 50 in the place positioned apart from the connecting position to the gate pad 11 causes a temporal shift from the electric potentials of the gate pad 11 and the gate wiring 12. The temporal shift is determined by a time constant determined by a resistance component such as the resistance of the gate electrode 50 and a parasitic capacitance formed together with the source pad 10 or the like. In the present embodiment, the gate wiring 12 having a low resistance is provided in parallel with the gate electrode 50 in an outer peripheral part. Therefore, the temporal shift can be prevented from being caused.

Although the description and illustration has been given to the example in which the p-type impurity concentrations and the depths of the first well region 41 and the second well regions 42 and 43 are equal to each other in the power semiconductor device according to the present embodiment, moreover, the impurity concentrations and the depths in these regions do not need to be equal to each other but may have different values from each other.

In addition, a method of disposing a unit cell in a cell region does not need to be that in FIG. 2 in which square unit cells are arranged like a grid. For example, the unit cells in adjacent columns may be disposed alternately. Moreover, the shape of the unit cell does not need to be the square but may be a rectangle, a hexagon, a triangle or the like.

Although the description has been given to the state in which the well contact region is individually positioned under the contact hole in the power semiconductor device according to the present embodiment, furthermore, the first well contact region 62 and the second well contact region 63 may be formed continuously by a sectional depth method.

In the power semiconductor device according to the present embodiment, moreover, the gate wiring 12 is disposed on the outside of the second well contact hole 63 to be the well contact hole of the outermost well. For this reason, it is not necessary to form the field plate on the outside of the gate wiring 12 and it is possible to reduce the size of the power semiconductor device and to cut down the cost of the power semiconductor device.

Second Embodiment

Figure 14:
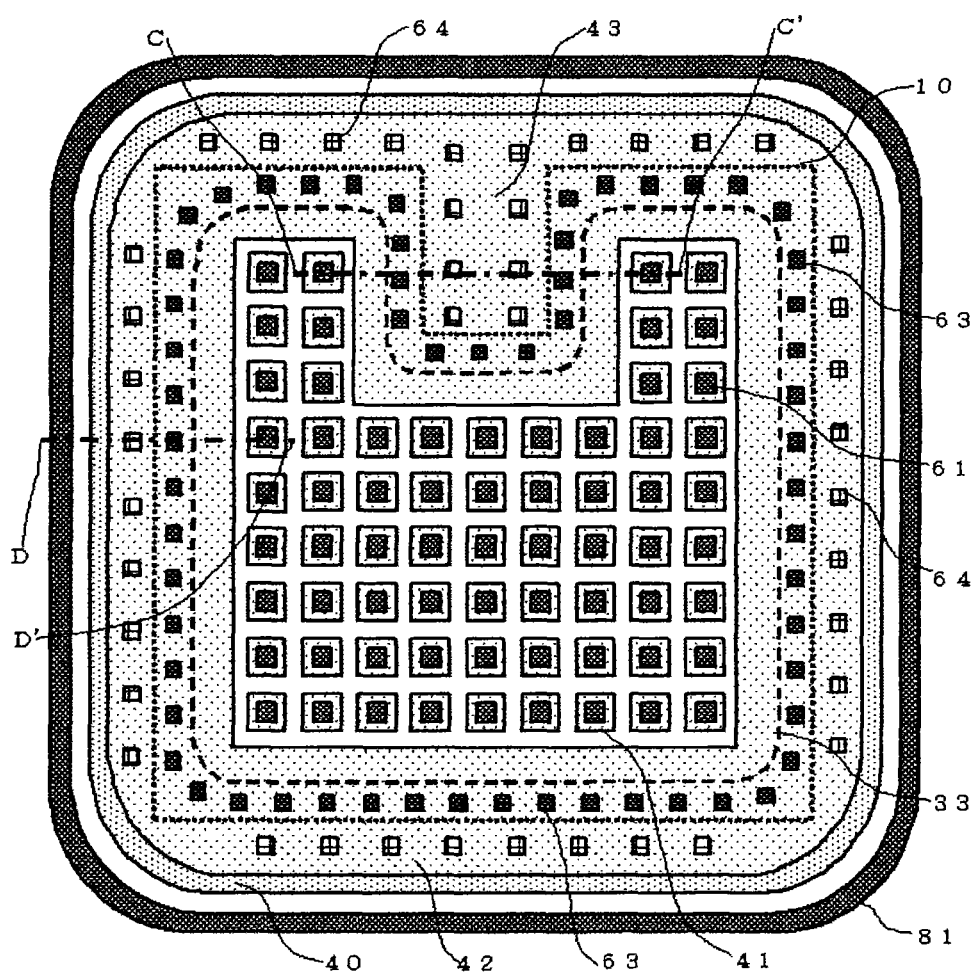
FIG. 14 is a plan view typically illustrating a power semiconductor device according to a second embodiment of the present invention.
Figure 15:
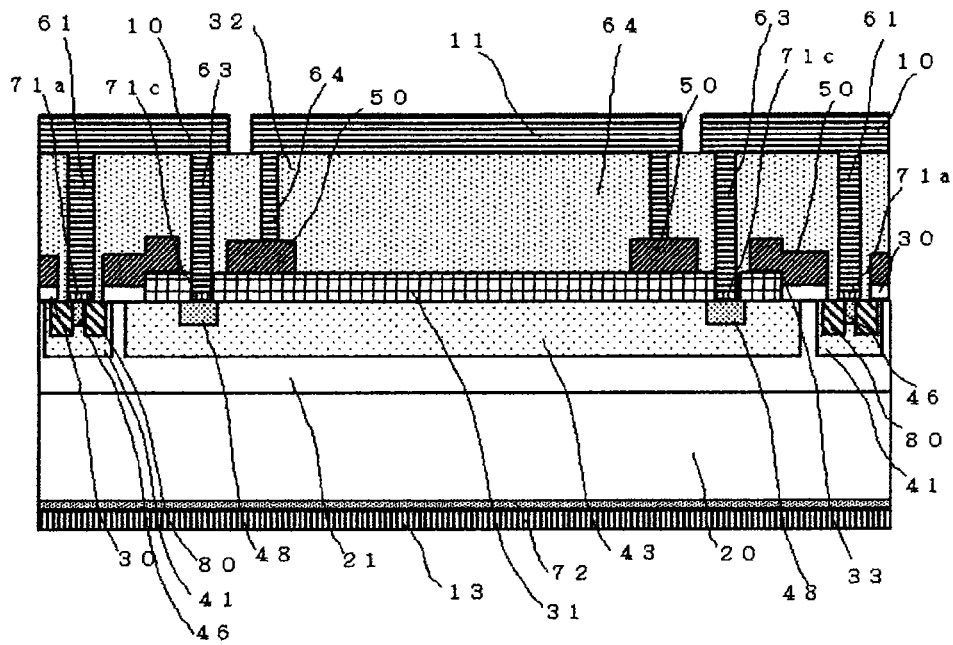
FIG. 15 is a sectional view typically illustrating a part of the power semiconductor device for explaining a process for manufacturing the power semiconductor device according to the second embodiment of the present invention.
Figure 16:
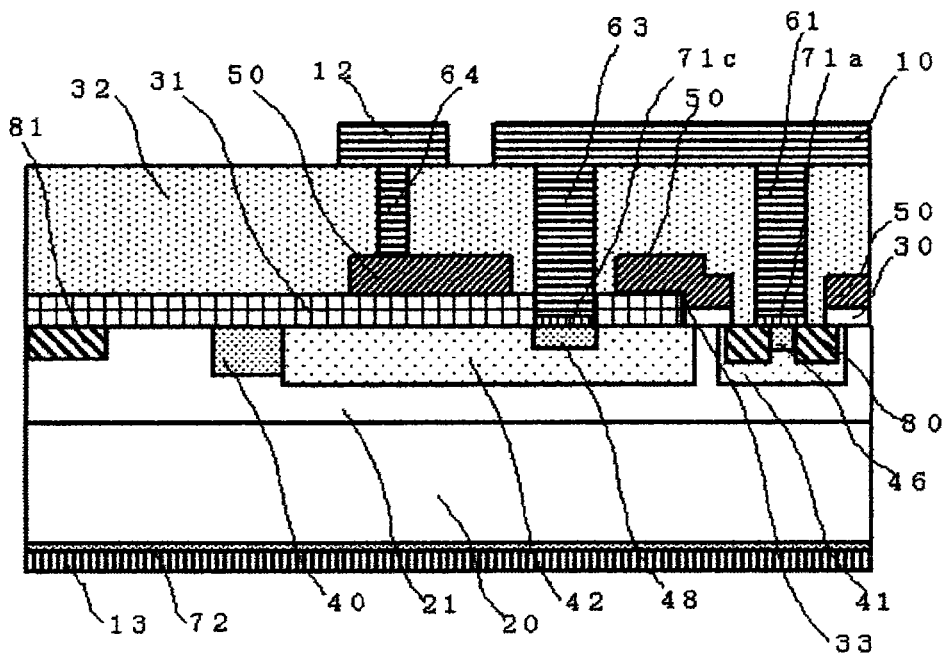
FIG. 16 is a sectional view typically illustrating a part of the power semiconductor device for explaining the process for manufacturing the power semiconductor device according to the second embodiment of the present invention.

FIG. 14 is a perspective plan view showing a power semiconductor device according to a second embodiment of the present invention as seen from an upper surface. Moreover, FIG. 15 is a sectional view showing a C-C' section in FIG. 14 and FIG. 16 is a sectional view showing a D-D' section in FIG. 14.

The power semiconductor device according to the present embodiment is obtained by removing the first well contact hole 62 and the second ohmic electrode 71b from the power semiconductor device according to the first embodiment. Since the other portions are the same as those described in the first embodiment, description will be omitted.

Also in the power semiconductor device according to the present embodiment, when the power semiconductor device is switched from an ON state to an OFF state, most of a displacement current generated in second well regions 42 and 43 flows to a source pad 10 via a second well contact hole 63 penetrating a field insulating film 31 provided on an opposite side to a first well region 41 side in a region in which a gate insulating film 30 is formed.

For this reason, also in the case in which the power semiconductor device according to the present embodiment is subjected to high speed switching, a high electric field is not applied to the gate insulating film 30. Moreover, it is possible to provide a power semiconductor device having a high reliability with a simple structure without providing the first well contact hole 62.

According to the power semiconductor device in accordance with the present embodiment, thus, there are omitted the first well contact hole 62, the second well contact region 47 and the second ohmic electrode 71b which are provided in the second well region 43 according to the first embodiment. Consequently, it is possible to reduce a size in a lateral direction of the section of the power semiconductor device, thereby causing the power semiconductor device to be small-sized.

In order to prevent a high electric field from being applied to the gate insulating film 30, a projection length of the second well regions 42 and 43 toward the gate insulating film 30 side is desirably set to be approximately 10 to 20 μm or less from the second well contact hole 63 even if it is large, and is desirably set to be 100 μm or less at a maximum.

Third Embodiment

Figure 17:
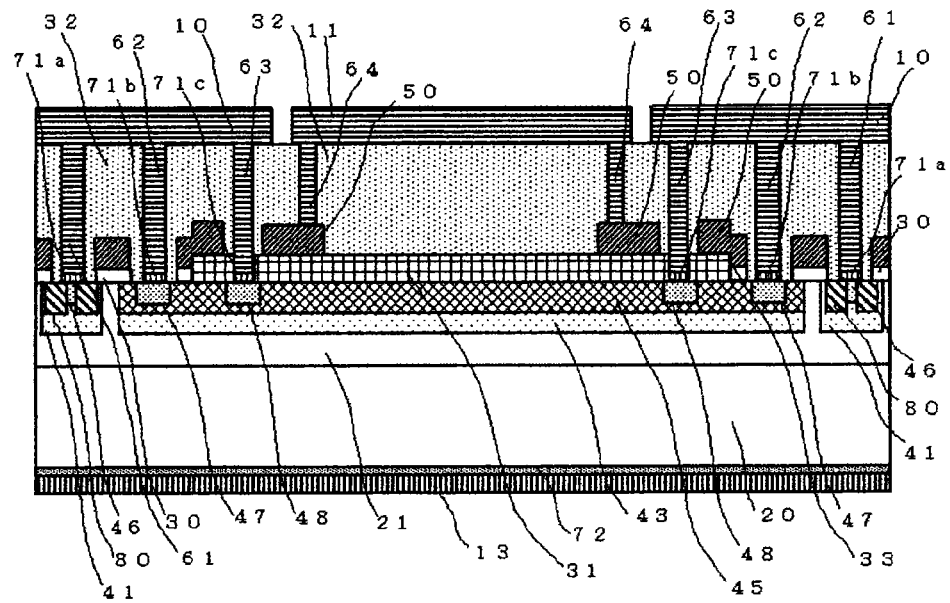
FIG. 17 is a sectional view typically illustrating a section of a part of a power semiconductor device according to a third embodiment of the present invention.
Figure 18:
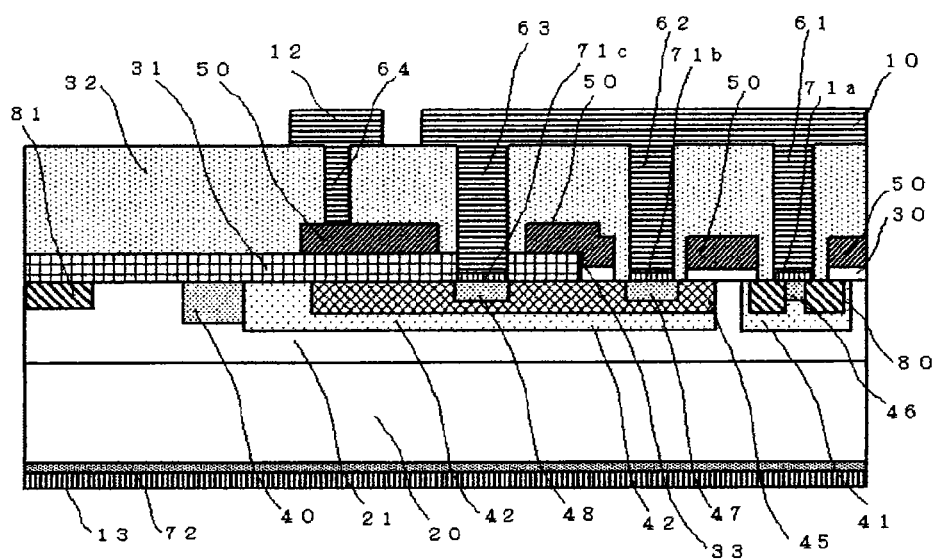
FIG. 18 is a sectional view typically illustrating the section of the part of the power semiconductor device according to the third embodiment of the present invention.
Figure 19:
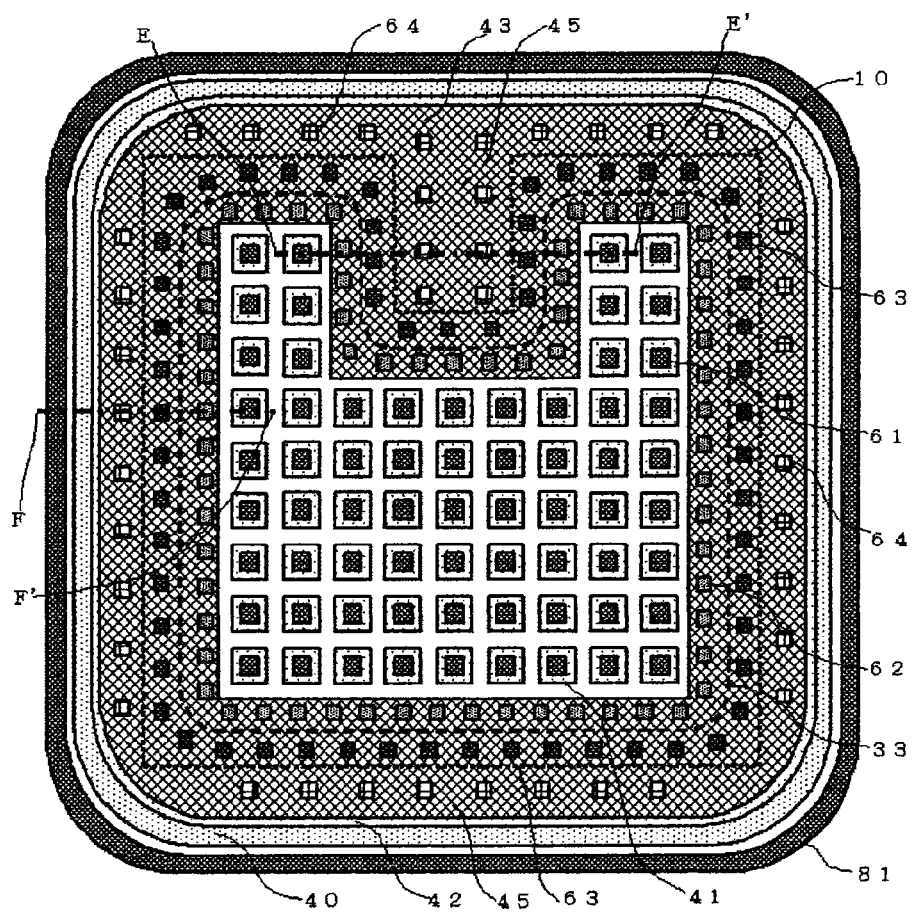
FIG. 19 is a plan view typically illustrating the power semiconductor device according to the third embodiment of the present invention.

FIGS. 17 and 18 are typical sectional views showing a power semiconductor device according to the present embodiment in which a high impurity concentration well region 45 doped with an impurity of a second conductivity type at a high concentration is provided in the surface layer portions of the second well regions 42 and 43 in the power semiconductor device according to the first embodiment in order to reduce resistances in a lateral direction of the sections of the second well regions 42 and 43 in the power semiconductor device according to the first embodiment. Since the other portions are the same as those described in the first embodiment, detailed description will be omitted. FIG. 19 is a top view showing the power semiconductor device according to the present embodiment, and FIGS. 17 and 18 correspond to sectional views showing E-E' and F-F' sections in FIG. 19 respectively.

In the case in which an impurity concentration which is suitable for the high impurity concentration well region 45 is set to be the impurity concentration of the high impurity concentration well region 45 by a dedicated photolithography process, it is preferably set to be higher than the impurity concentrations of the second well regions 42 and 43, that is, approximately $1 \times 10^{20}$ cm$^{-3}$, and is desirably set to be $1 \times 10^{21}$ cm$^{-3}$ at most.

Figure 20:
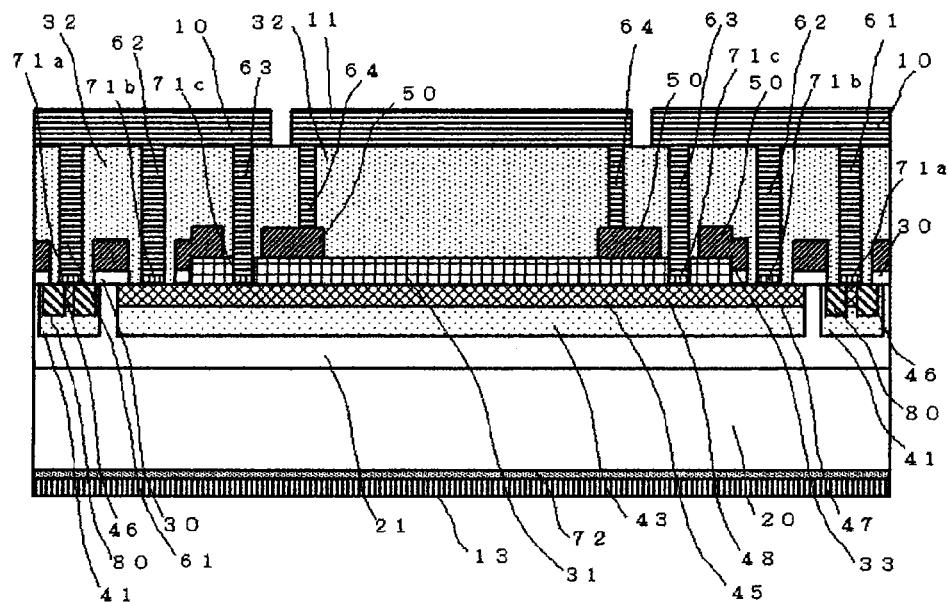
FIG. 20 is a sectional view typically illustrating a section of a part of the power semiconductor device according to the third embodiment of the present invention.
Figure 21:
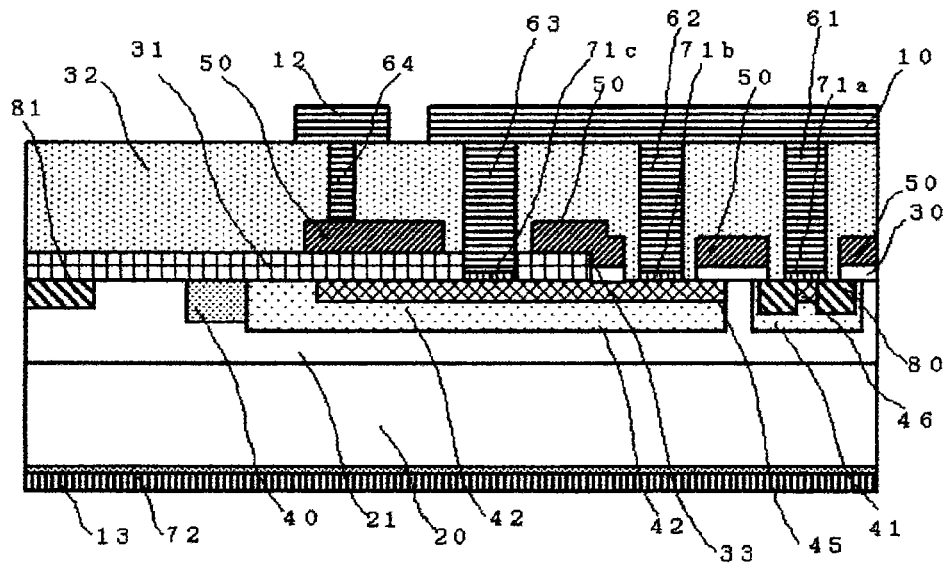
FIG. 21 is a sectional view typically illustrating the section of the part of the power semiconductor device according to the third embodiment of the present invention.

As shown in sectional views of FIGS. 20 and 21, moreover, when the first to third well contact regions 46, 47 and 48 of the power semiconductor device according to the first embodiment are to be formed by ion implantation, ion implantation mask patterns of the second well contact region 47 and the third well contact region 48 are changed into the same pattern as the second well regions 42 and 43. Consequently, it is possible to reduce the resistances in the lateral direction of the sections of the second well regions 42 and 43 without increasing the photolithography process.

According to the power semiconductor device in accordance with the present embodiment, the high impurity concentration well region 45 is provided in the surface layer portions of the second well regions 42 and 43. When switching from an ON state to an OFF state is carried out, it is possible to reduce a voltage to be generated by currents generated in the second well regions 42 and 43. In addition, most of a displacement current flows to a source pad 10 via a second well contact hole 63 provided to penetrate a field insulting film 31. For this reason, also in the case in which high speed switching is carried out, it is possible to suppress an application of a high electric field to the field insulating film 31 as well as a gate insulating film 30. Thus, it is possible to obtain a power semiconductor device having a high reliability.

Fourth Embodiment

Figure 22:
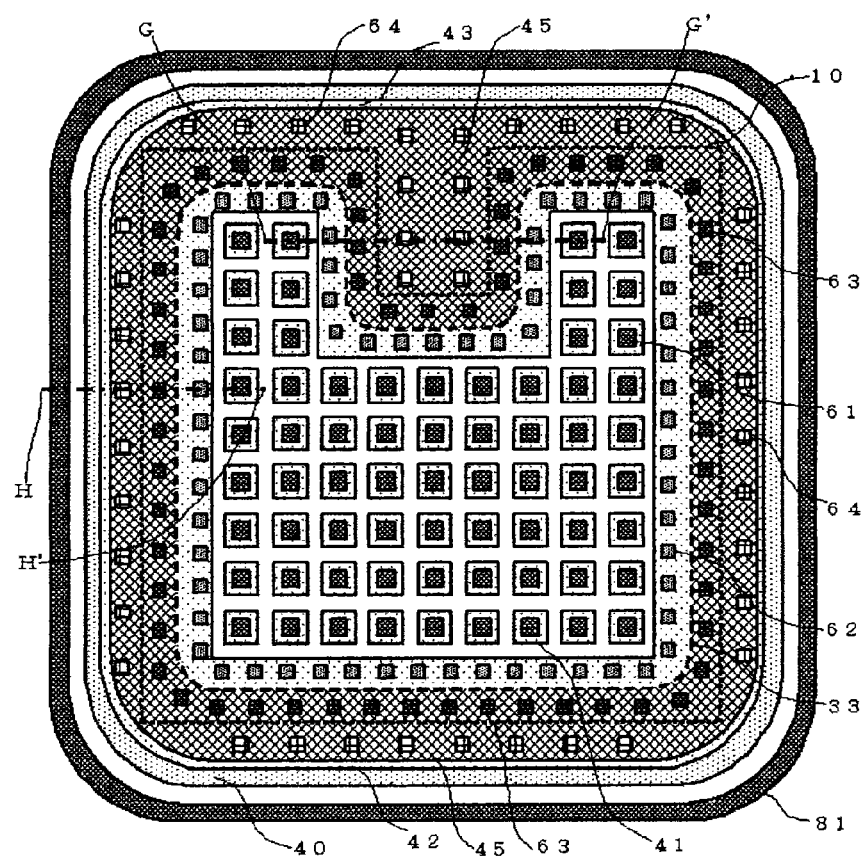
FIG. 22 is a plan view typically illustrating a power semiconductor device according to a fourth embodiment of the present invention.
Figure 23:
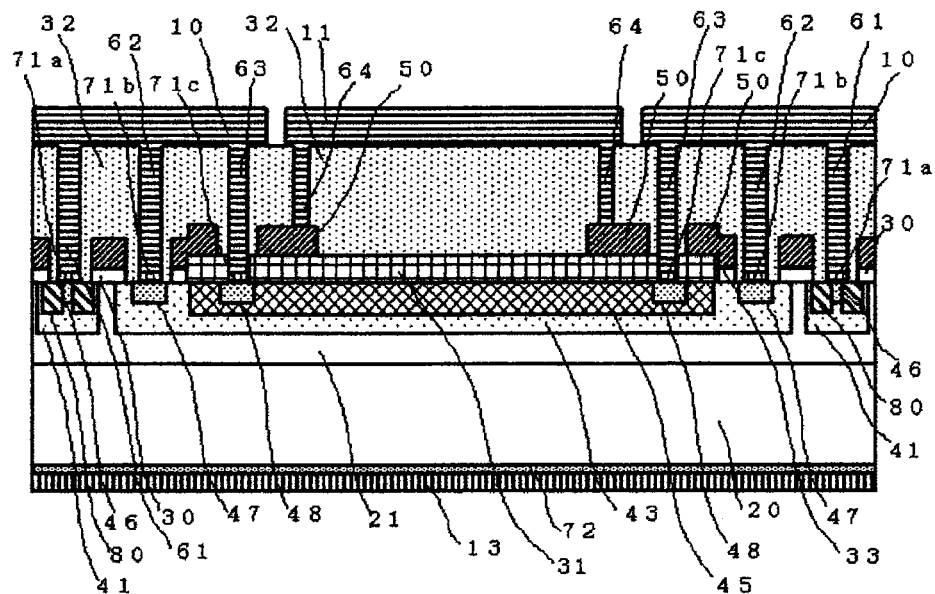
FIG. 23 is a sectional view typically illustrating a section of a part of the power semiconductor device according to the fourth embodiment of the present invention.
Figure 24:
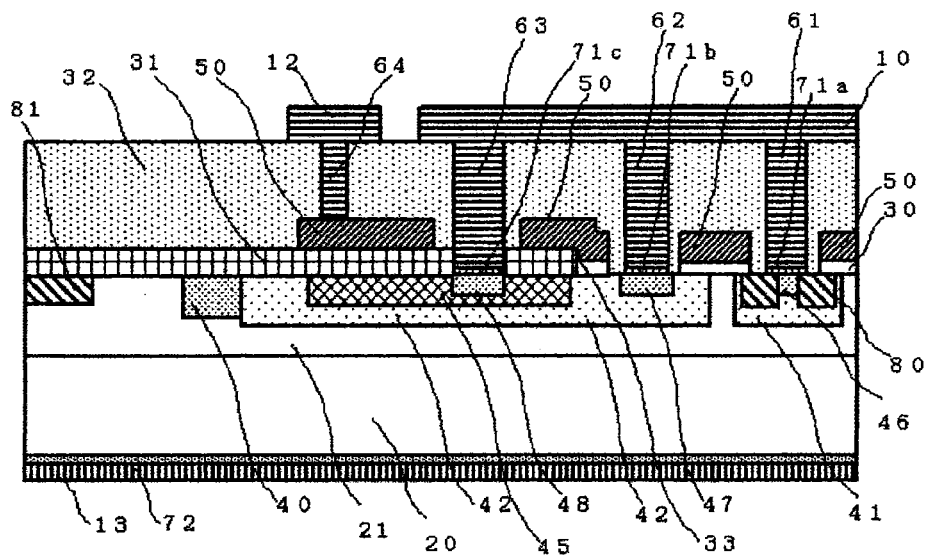
FIG. 24 is a sectional view typically illustrating the section of the part of the power semiconductor device according to the fourth embodiment of the present invention.

FIG. 22 is a perspective plan view showing a power semiconductor device according to the present embodiment as seen from an upper surface. Moreover, FIGS. 23 and 24 are typical sectional views showing the power semiconductor device according to the present embodiment, typically illustrating a section of a G-G' portion and a section of an H-H' portion in the plan view of FIG. 22 respectively.

In the power semiconductor device according to the present embodiment, a high impurity concentration well region 45 doped with an impurity of a second conductivity type at a high concentration is provided in only a portion from which a lower part of a region having the gate oxide film 30 formed therein is removed in any of the second well regions 42 and 43 of the power semiconductor device according to the first embodiment in which the gate electrode 50, the gate pad 11, the gate wiring 12 and the like are provided. Since the other portions are the same as those described in the first embodiment, detailed description will be omitted.

In the power semiconductor device according to the present embodiment, the high impurity concentration well region 45 doped with the impurity of a second conductivity type at a high concentration is provided in the portion from which the lower part of the region having the gate oxide film 30 formed therein is removed in any of the second well regions 42 and 43 in which the gate electrode 50, the gate pad 11, the gate wiring 12 and the like are provided. Therefore, it is possible to reduce the resistance values in the lateral direction of the sections in the second well regions 42 and 43 as compared with the power semiconductor device according to the first embodiment. Thus, it is possible to reduce a voltage to be generated by a displacement current in switching. As compared with the power semiconductor device according to the third embodiment, moreover, it is possible to avoid the formation of the gate insulating film 30 on a silicon carbide layer doped with an impurity in a high concentration. Thus, it is possible to enhance a reliability of an insulation property in the gate insulating film 30.

In some cases in which the gate insulating film 30 is formed by a thermal oxidation method, particularly, there is deteriorated the insulation reliability of the gate insulating film 30 formed by thermally oxidizing a silicon carbide layer doped with an impurity in a high concentration by ion implantation. By employing the structure according to the present embodiment, therefore, it is possible to obtain a power semiconductor device having a higher reliability.

It is preferable that the impurity concentration of the high impurity concentration well region 45 should be equal to or higher than $3 \times 10^{18}$ cm$^{-3}$ and be equal to or lower than $1 \times 10^{21}$ cm$^{-3}$. By forming the high impurity concentration well region 45 simultaneously with the photolithography process in the formation of the first to third well contact regions 46, 47 and 48, moreover, it is possible to form the high impurity concentration well region 45 without increasing the steps.

Fifth Embodiment

Figure 25:
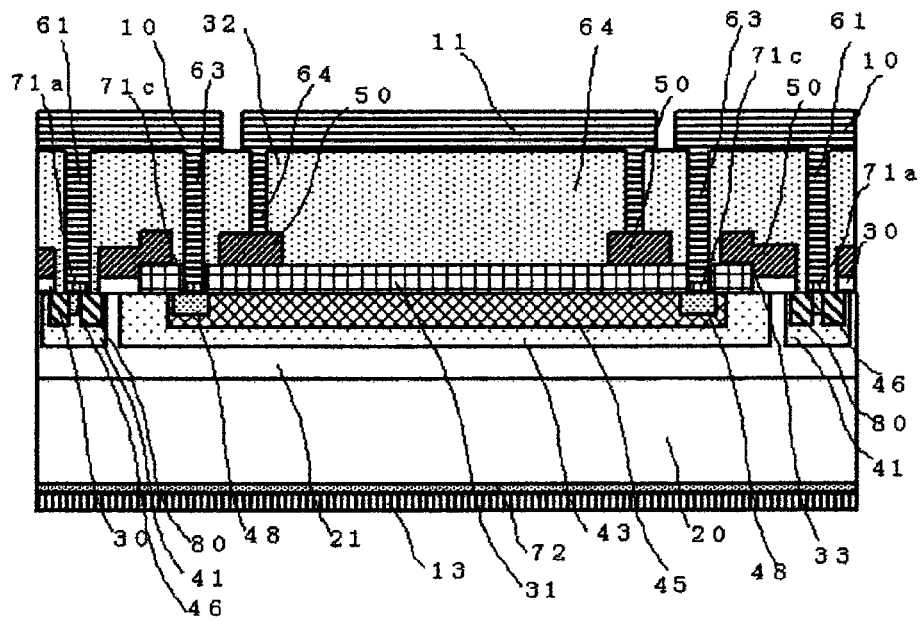
FIG. 25 is a sectional view typically illustrating a section of a part of a power semiconductor device according to a fifth embodiment of the present invention.
Figure 26:
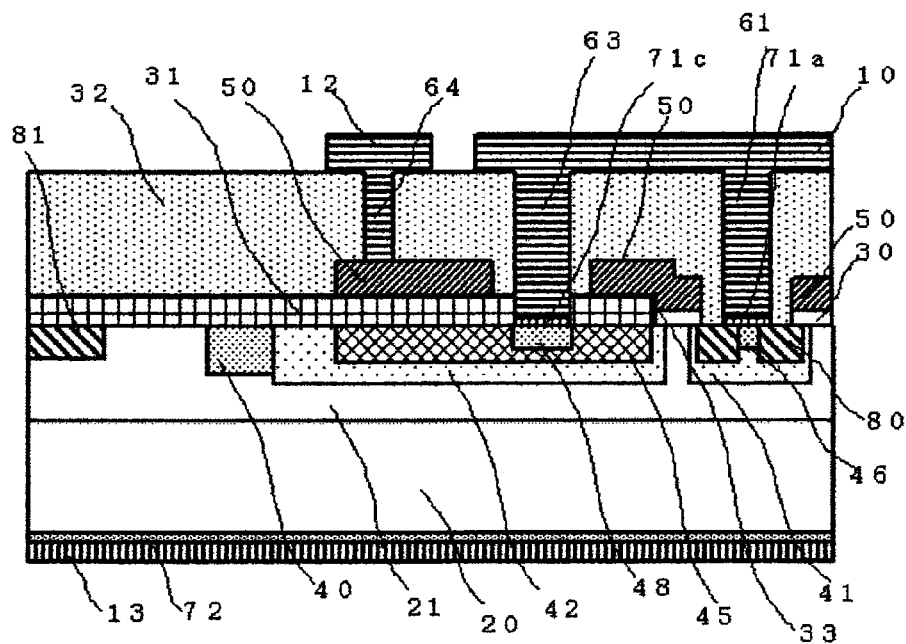
FIG. 26 is a sectional view typically illustrating the section of the part of the power semiconductor device according to the fifth embodiment of the present invention.

FIGS. 25 and 26 are typical sectional views showing a section of a power semiconductor device according to the present embodiment, and correspond to the section of the C-C' portion and the section of the D-D' portion in the plan view of FIG. 14 according to the second embodiment.

According to the power semiconductor device in accordance with the present embodiment, a high impurity concentration well region 45 doped with an impurity of a second conductivity type at a high concentration is provided in only a portion from which a lower part of a region having the gate oxide film 30 formed therein is removed in any of the second well regions 42 and 43 of the power semiconductor device according to the second embodiment in which the gate electrode 50, the gate pad 11, the gate wiring 12 and the like are provided. Since the other portions are the same as those described in the second embodiment, detailed description will be omitted.

According to the power semiconductor device in accordance with the present embodiment, the high impurity concentration well region 45 is provided in the portion from which the lower part of the region having the gate oxide film 30 formed therein is removed in any of the second well regions 42 and 43 in which the gate electrode 50, the gate pad 11, the gate wiring 12 and the like are provided. As compared with the power semiconductor device according to the second embodiment, therefore, it is possible to avoid the formation of the gate insulating film 30 on a silicon carbide layer doped with an impurity in a high concentration. Thus, it is possible to enhance a reliability of an insulation property in the gate insulating film 30.

In the power semiconductor device according to the present embodiment, it is preferable that the impurity concentration of the high impurity concentration well region 45 should be equal to or higher than $3 \times 10^{18}$ cm$^{-3}$ and be equal to or lower than $1 \times 10^{21}$ cm$^{-3}$. By forming the high impurity concentration well region 45 simultaneously with the photolithography process in the formation of the first well contact region 46, the second well contact region 47 and the third well contact region 48, moreover, it is possible to form the high impurity concentration well region 45 without increasing the steps.

In the first to fifth embodiments, there is disclosed the case in which the semiconductor element to be formed in the cell region is the vertical MOSFET. Even if a collector layer of a second conductivity type is provided between the semiconductor substrate 20 and the back ohmic electrode 72 on the back side in FIG. 3 to constitute a semiconductor element having a cell region of an IGBT, for example, the effect of the present invention can also be produced for the semiconductor element having the cell region of the IGBT. Accordingly, a range in which the present invention is effective is a semiconductor element to be a switching element having an MOS structure such as an MOSFET or an IGBT. In the case in which the semiconductor element is the IGBT, a drain (electrode) of the MOSFET corresponds to a collector (electrode) and a source (electrode) of the MOSFET corresponds to an emitter (electrode).

Also in a trench type MOSFET in which a channel region is formed perpendicularly to the surface of the semiconductor substrate 20, moreover, the connecting portion from the second well regions 42 and 43 to the source pad 10 is formed on a close side to the gate pad 11 or the gate wiring 12 from the connecting portion of the end of the field insulating film 31 and the gate insulating film 30. Also when the switch is turned OFF at a high speed, consequently, it is possible to reduce a voltage to be generated by a displacement current in the vicinity of the gate insulating film 30. Consequently, it is possible to obtain a power semiconductor device having a high reliability.

If the structures of the power semiconductor devices described in the first to fifth embodiments are provided, furthermore, the effect of the present invention does not depend on the manufacturing method. Also in a structure of a power semiconductor device manufactured by using a manufacturing method other than the manufacturing methods described in the first to fifth embodiments, it is possible to obtain a power semiconductor device structure having a high reliability.

Although the description has been given to the example of the power semiconductor devices constituted mainly by the silicon carbide material in the first to fifth embodiments, moreover, the present invention is not restricted to the power semiconductor device constituted by the silicon carbide but a power semiconductor device constituted by another semiconductor material such as a wide band gap semiconductor material, for example, gallium nitride, a gallium arsenide material or an Si material can also produce the same effect.

Moreover, the gate insulating film 30 of the power semiconductor device described as the vertical MOSFET in the first to fifth embodiments does not need to be always an oxide film such as silicon dioxide as the name of MOS implies but may be an insulating film such as a silicon nitride film or an aluminum oxide film.

In the present invention, furthermore, the semiconductor element itself having the MOSFET structure described in the first to fifth embodiments is defined as a "semiconductor device" in a narrow sense. In addition, it is also possible to define, as a "semiconductor device" in a broad sense, a power module itself incorporating a semiconductor element, such as an inverter module mounted on a lead frame and sealed together with the semiconductor element having the MOSFET structure, a free wheel diode to be connected to the semiconductor element in reverse parallel, a control circuit for generating and applying a gate voltage of the semiconductor element and the like.

Explanation of Designation

10 source pad,
11 gate pad,
12 gate wiring,
13 drain electrode,
20 semiconductor substrate,
21 drift layer,
30 gate insulating film,
31 field insulating film,
32 interlayer insulating film,
33 gate insulating film and field insulating film boundary,
40 JTE region,
41 first well region,
42, 43 second well region,
45 high impurity concentration well region,
46, 47, 48 well contact region,
50 gate electrode,
61 source contact hole,
62 first well contact hole,
63 second well contact hole,
64 gate contact hole,
71 ohmic electrode,
72 back ohmic electrode,
80 source region,
81 field stopper region,
100 simplified element,
101 n-type semiconductor substrate,
102 n-type layer,
103 p-type well region,
104 p-type well contact,
105 interlayer insulating film,
106 upper electrode,
107 contact hole,
108 back electrode,
109 back ohmic electrode,
110 ohmic electrode,
111 gate insulating film,
112 gate electrode,
113 gate upper electrode.

The invention claimed is:

1. A power semiconductor device comprising:
   a semiconductor substrate of a first conductivity type;
   a drift layer of the first conductivity type which is formed on a first main surface side of said semiconductor substrate;
   a cell region formed in a part of said drift layer and comprising a plurality of unit cells;
   a well region of a second conductivity type which is formed in another part of said drift layer;
   a gate insulating film formed on said cell region;
   a field insulating film formed on said well region;
   a gate electrode formed over said cell region and over said well region;
   a source pad for electrically connecting said cell region and said well region through a source contact hole formed on said cell region and a well contact hole formed on said well region;
   a gate pad electrically connected to said gate electrode; and
   a drain electrode formed on a second main surface of said semiconductor substrate wherein the well contact hole defines opposite sides, with the cell region on one of said sides of the well contact hole and the gate electrode on another of said sides of the well contact hole,
   wherein the field insulating film under an entire portion of the gate electrode at said another side is thicker than the gate insulating film at said one side over said well region.

2. The power semiconductor device according to claim 1, wherein a projection length from said well contact hole of said well region toward said cell region side is equal to or smaller than 100 μm.

3. The power semiconductor device according to claim 1, further comprising another well contact hole formed to penetrate said gate insulating film on said well region,
   said source pad electrically connecting said cell region and said well region through said source contact hole, and said another well contact hole and said well contact hole.

4. The power semiconductor device according to claim 1, further comprising:
   a gate contact hole formed on said well region,
   wherein the gate pad is connected electrically to said gate electrode through said gate contact hole.

5. The power semiconductor device according to claim 1, further comprising a plurality of well contact holes which surround said cell region.

6. The power semiconductor device according to claim 1, wherein said semiconductor substrate and said drift layer comprise a wide band gap semiconductor material.

7. The power semiconductor device according to claim 6, wherein said wide band gap semiconductor material is silicon carbide.

8. The power semiconductor device according to claim 1, wherein said well region is a part of a surface layer of said well region, and includes a high impurity concentration well region having a higher impurity concentration of the second conductivity type than other regions in said well region under said well contact hole.

9. The power semiconductor device according to claim 8, wherein said high impurity concentration well region is continuously formed under said gate electrode from a lower part of said well contact hole.

10. The power semiconductor device according to claim 8, wherein said high impurity concentration well region is not formed under said gate insulating film provided on said well region.

11. The power semiconductor device according to claim 1, wherein said unit cell includes a source region of the first conductivity type and another well region of the second conductivity type, and
   a channel region formed in said another well region interposed between said source region and said drift layer is parallel with said first main surface.

12. The power semiconductor device according to claim 1, wherein said unit cell includes a source region of the first conductivity type and another well region of the second conductivity type, and
   a channel region formed in said another well region interposed between said source region and said drift layer is perpendicular to said first main surface.

13. The power semiconductor device according to claim 1, wherein a change speed of a voltage applied between said source pad and said drain electrode is equal to or higher than 10 V/nsec.

14. A power module comprising a lead frame provided with the power semiconductor device according to claim 1 and a control circuit for controlling an operation of said power semiconductor device.

15. The power semiconductor device according to claim 1, wherein:
   a boundary between the gate insulating film and the field insulating film is on said well region.

16. A method for manufacturing a power semiconductor device, the method comprising:
   forming a drift layer of a first conductivity type on a first main surface side of a semiconductor substrate of the first conductivity type;
   forming a well region of a second conductivity type in a surface layer of said drift layer;
   forming a field oxide film on said well region;
   forming a gate insulating film on a cell region of a surface layer of the drift layer;
   forming a gate electrode on said field oxide film and on said gate insulating film;
   forming a source pad for electrically connecting said cell region and said well region through a well contact hole; and
   forming a drain electrode on a second main surface side opposite to said first main surface of said semiconductor substrate,
   wherein the well contact hole defines opposite sides, with the cell region on one of said sides of the well contact hole and the gate electrode on another of said sides of the well contact hole, and
   wherein the field insulating film under an entire portion of the gate electrode at said another side is thicker than the gate insulating film at said one side over said well region.

17. The method of claim 16, wherein
said forming of the field oxide comprises removing the field oxide film in a place where the well contact hole is formed.

18. The power semiconductor device according to claim 1, further comprising:
   a collector layer of a second conductivity type between said semiconductor substrate and said drain electrode.

* * * * *